(12) United States Patent
Li et al.

(10) Patent No.: US 11,898,072 B2
(45) Date of Patent: Feb. 13, 2024

(54) FLUORESCENT SEMICONDUCTOR NANOCRYSTAL MATERIAL, PREPARATION AND APPLICATION THEREOF

(71) Applicant: SHANGHAI JIAO TONG UNIVERSITY, Shanghai (CN)

(72) Inventors: Liang Li, Shanghai (CN); Qinggang Zhang, Shanghai (CN)

(73) Assignee: SHANGHAI JIAO TONG UNIVERSITY, Shanghai (CN)

( * ) Notice: Subject to any disclaimer, the term of this patent is extended or adjusted under 35 U.S.C. 154(b) by 362 days.

(21) Appl. No.: 17/338,306

(22) Filed: Jun. 3, 2021

(65) Prior Publication Data

US 2021/0292642 A1 Sep. 23, 2021

Related U.S. Application Data

(63) Continuation of application No. PCT/CN2019/119224, filed on Nov. 18, 2019.

(30) Foreign Application Priority Data

Oct. 31, 2019 (CN) .......................... 201911055146.5

(51) Int. Cl.
*C09K 11/02* (2006.01)
*H01L 33/50* (2010.01)
(Continued)

(52) U.S. Cl.
CPC ............ *C09K 11/02* (2013.01); *C09K 11/565* (2013.01); *C09K 11/621* (2013.01);
(Continued)

(58) Field of Classification Search
CPC ..... H01L 33/502; C09K 11/02; C09K 11/025; C09K 11/0811; C09K 11/0827;
(Continued)

(56) References Cited

U.S. PATENT DOCUMENTS

| 9,577,127 B1* | 2/2017 | Wang ................. H01L 31/0216 |
| 2009/0233080 A1* | 9/2009 | Burrell ................. C09K 11/671 |
| | | 428/338 |
| 2017/0271562 A1* | 9/2017 | Wang ................ G02F 1/133528 |

FOREIGN PATENT DOCUMENTS

| CN | 104370302 A | 2/2015 |
| CN | 110205110 A | 9/2019 |

OTHER PUBLICATIONS

Lu Mengchen; Synthesis of SnO2 and ZnS:Mn Quantum Dots Embedded in Silica Glass via SPS and its Optical Properties Research; May 15, 2017; China Master's Theses Full-text Database.
(Continued)

*Primary Examiner* — Matthew E. Hoban

(57) ABSTRACT

A method for preparing a fluorescent semiconductor nanocrystal material. At least one semiconductor nanocrystal precursor is uniformly mixed with a micro/mesoporous material to form a mixture. The mixture is calcined under a temperature higher than or equal to a collapse temperature of the micro/mesoporous material to obtain the fluorescent semiconductor nanocrystal material. This application also provides a fluorescent semiconductor nanocrystal material prepared through the method, and applications thereof in the manufacture of a light-emitting diode device and a color conversion display panel.

18 Claims, 13 Drawing Sheets

(51) Int. Cl.
  *C09K 11/56* (2006.01)
  *C09K 11/62* (2006.01)
  *C09K 11/66* (2006.01)
  *C09K 11/88* (2006.01)
  *G01N 21/64* (2006.01)
  *G01T 1/202* (2006.01)
  *H01L 27/146* (2006.01)

(52) U.S. Cl.
  CPC .......... *C09K 11/665* (2013.01); *C09K 11/883* (2013.01); *G01N 21/6428* (2013.01); *G01T 1/2023* (2013.01); *H01L 27/14663* (2013.01); *H01L 33/502* (2013.01)

(58) Field of Classification Search
  CPC ... C09K 11/0833; C09K 11/56; C09K 11/565; C09K 11/61; C09K 11/611613; C09K 11/616; C09K 11/665; C09K 11/7704; C09K 11/7705; C09K 11/7719; C09K 11/772; C09K 11/7732; C09K 11/7733
  See application file for complete search history.

(56) References Cited

OTHER PUBLICATIONS

Synthesis of Pb(Cd)S Quantum Dots Embedded in Silica Glass via SPS and its Performance Study; Yang, Fengbai, Jul. 15, 2015; China Master's Theses Full-text Database.

\* cited by examiner

FLUORESCENT SEMICONDUCTOR NANOCRYSTAL MATERIAL, PREPARATION AND APPLICATION THEREOF

CROSS-REFERENCE TO RELATED APPLICATIONS

This application is a continuation of International Patent Application No. PCT/CN2019/119224, filed on Nov. 18, 2019, which claims the benefit of priority from Chinese Patent Application No. 201911055146.5, filed on Oct. 31, 2019. The content of the aforementioned applications, including any intervening amendments thereto, is incorporated herein by reference.

TECHNICAL FIELD

This application relates to semiconductor nanomaterials, and more particularly to a fluorescent semiconductor nanocrystal material, and a preparation and application thereof.

BACKGROUND

Semiconductor nanocrystals, as a novel luminescent material, have the advantages of high fluorescence quantum efficiency, adjustable luminescence color and high color purity, and thus have been widely used in optoelectronic devices. Generally, the semiconductor nanocrystal is prepared in a specific environment, in which the growth space of the semiconductor nanocrystal precursors is limited during the reaction process to prepare the semiconductor nanocrystals through space-confined growth, enabling the obtained semiconductor nanocrystals to have fluorescence properties. Currently, the semiconductor nanocrystals are often prepared in solution by hot injection, water-in-oil method, coordination synthesis method, etc. However, the semiconductor nanocrystals synthesized by these methods have poor stability and are easy to be corroded or decomposed by light, heat, moisture, oxygen, etc. Moreover, the existing solution synthesis approaches involve the use of organic ligands and a large amount of organic solvent or water, and a large amount of waste liquid will be generated in the synthesis and purification process, causing environmental pollution, and directly affecting the application prospect of semiconductor nanocrystals.

In order to improve the stability of semiconductor nanocrystals, inorganic materials (such as silica, titania and alumina) are generally used to coat the semiconductor nanocrystals. However, these coating technologies cannot completely prevent the fluorescent semiconductor nanocrystal materials from being corroded by moisture and oxygen. The coating process still fails to provide the fluorescent semiconductor nanocrystal materials with desired light and thermal stability.

Therefore, it is of great significance to develop a suitable, environment-friendly and highly-stable method for preparing fluorescent semiconductor nanocrystal materials.

SUMMARY

To solve the above technical problems, this application provides a method for preparing a fluorescent semiconductor nanocrystal material, by which the semiconductor nanocrystal can be encapsulated inside a micro/mesoporous material, thereby making the obtained semiconductor nanocrystals more stable.

The technical solutions of this application are described as follows.

In a first aspect, this application provides a method for preparing a fluorescent semiconductor nanocrystal material, comprising:

(1) uniformly mixing at least one semiconductor nanocrystal precursor with a micro/mesoporous material to form a mixture; and (2) calcining the mixture under a temperature higher than or equal to a collapse temperature of the micro/mesoporous material to make pores of the micro/mesoporous material collapse, encapsulating the at least one semiconductor nanocrystal precursor in the pores of the micro/mesoporous material to produce the fluorescent semiconductor nanocrystal material.

In some embodiments, the at least one semiconductor nanocrystal precursor and the micro/mesoporous material are mixed uniformly through liquid phase mixing or solid phase mixing.

In some embodiments, the semiconductor nanocrystal precursors are respectively expressed as AX and $BX_2$; where A is selected from the group consisting of Cs, Rb, K, Ca, Sr, Ba and a combination thereof, preferably Cs, Rb, K or a combination thereof, and more preferably Cs, Rb or K; B is selected from the group consisting of Pb, Zn, Ca, Sr, Ba, Al, Ga, In, Ge, Sn, Cu, Mn, Sb, Bi, Ag and a combination thereof, preferably Pb, Zn, Ca, Sr, Ba, Sn, Cu, Mn, Sb, Bi or a combination thereof, and more preferably Pb, Sn, Zn, Ca or Ba; and X is selected from the group consisting of Cl, Br, I and a combination thereof, preferably Cl, Br or I.

In some embodiments, the at least one semiconductor nanocrystal precursor consists of an AX precursor and a $BX_2$ precursor; a molar ratio of the AX precursor to the $BX_2$ precursor is 1:1; A is Cs, Rb or K; B is Pb, Sn, Zn, Ca or Ba; and X is Cl, Br or I.

In some embodiments, the at least one semiconductor nanocrystal precursor consists of an AX precursor, a $B'X_2$ precursor and a $BX_2$ precursor; a molar ratio of the AX precursor to the sum of the $B'X_2$ precursor and the $BX_2$ precursor is 1:1; A is Cs, Rb or K; B' and B are different, and are each independently selected from the group consisting of Pb, Sn, Zn, Ca and Ba; and X is Cl, Br or I.

In some embodiments, the at least one semiconductor nanocrystal precursors consists of a cationic precursor and an anionic precursor; a molar ratio of the cationic precursor to the anionic precursor is 1:1; the cationic precursor is used to provide a cation $D^{n+}$, wherein n is an integer selected from 1-10; the cationic precursor is selected from the group consisting of hydrochloride, nitrate, sulfate, bisulfate, carbonate and bicarbonate of Zn, Cd, Hg, Pb, Sn, Ga, In, Ca, Ba, Cu, W and Mo, and hydrate thereof; the anionic precursor is used to provide an anion $Y^{n-}$, wherein n is an integer selected from 1-10; and the anionic precursor is selected from the group consisting of simple substances and inorganic salts of S, Se, Te, N, P, Sb and As.

In some embodiments, the cationic precursor is selected from the group consisting of hydrochlorides and nitrates of Zn, Cd and Hg and hydrates thereof; and the anionic precursor is selected from the group consisting of simple substances and inorganic salts of S, Se and Te.

In some embodiments, the at least one semiconductor nanocrystal precursor consists of a first precursor for providing a monovalent cation, a second precursor for providing a trivalent cation and a third precursor for providing a divalent anion;

wherein the first precursor is a compound of a IB group metal, preferably a halide of the IB group metal, such as chloride, bromide and iodide of the IB group metal;

the second precursor is an organic acid salt of a IIIA group metal, preferably a formate, acetate or propionate of the IIIA group metal; and the third precursor is an inorganic salt consisting of a VIA group element and a metal element;

a molar ratio of the first precursor to the second precursor to the third precursor is 0.5:0.5:1.

In some embodiments, the first precursor is selected from the group consisting of CuCl, CuBr, CuI, AgCl, AgBr, AgI and a combination thereof; the second precursor is selected from the group consisting of formate, acetate and propionate of In, Ga and Al, such as $In(C_2H_3O_2)_3$, $Ga(C_2H_3O_2)_3$ and $Al(C_2H_3O_2)_3$; in the third precursor, the VIA group element is S or Se, and the metal element is Na or K; and a molar ratio of the first precursor to the second precursor to the third precursor is 0.5:0.5:1.

In some embodiments, the micro/mesoporous material is a microporous material, a mesoporous material or a combination thereof; the microporous material is selected from the group consisting of microporous molecular sieve, microporous silica, microporous titania, microporous alumina, microporous transition metal oxide, microporous sulfide, silicate, aluminate, transition metal nitride and a combination thereof; and the mesoporous material is selected from the group consisting of mesoporous molecular sieve, mesoporous silica, mesoporous titania, mesoporous alumina, mesoporous carbon, mesoporous transition metal oxide, mesoporous sulfide, silicate, aluminate, transition metal nitride and a combination thereof.

In some embodiments, a pore size of the micro/mesoporous material is 0.5-50 nm.

In some embodiments, in step (2), the calcination is performed at 300-2000° C. for 10-600 min, preferably 10-60 min. In an embodiment, the calcination is performed under a pressure of 0.1-20 MPa to prepare the fluorescent semiconductor nanocrystal material.

The method of this application can load the semiconductor nanocrystal precursor in the pores of the micro/mesoporous material, and the growth of the semiconductor nanocrystals is confined by the micro/mesopores in the material. After calcined at high temperature, the pores of the micro/mesoporous material experience a collapse, thereby encapsulating the semiconductor nanocrystals in the pores of the micro/mesoporous material to obtain a highly-stable fluorescent semiconductor nanocrystal material. The obtained semiconductor nanocrystal fluorescent material can effectively resist the corrosion by moisture, oxygen and light, allowing for improved stability.

In a second aspect, this application provides a fluorescent semiconductor nanocrystal material prepared by the above method.

In some embodiments, the semiconductor nanocrystal fluorescent material prepared by the method of the disclosure has a nanocrystal structure of perovskite $ABX_3$; A is selected from the group consisting of Cs, Rb, K, Ca, Sr, Ba and a combination thereof, preferably Cs, Rb, K or a combination thereof, and more preferably Cs, Rb or K; B is selected from the group consisting of Pb, Zn, Ca, Sr, Ba, Al, Ga, In, Ge, Sn, Cu, Mn, Sb, Bi, Ag and a combination thereof, preferably Pb, Zn, Ca, Sr, Ba, Sn, Cu, Mn, Sb, Bi or a combination thereof, and more preferably Pb, Sn, Zn, Ca or Ba; and X is selected from the group consisting of Cl, Br, I and a combination thereof, preferably Cl, Br or I.

In some embodiments, the fluorescent semiconductor nanocrystal material prepared by the method of the disclosure has a nanocrystal structure of perovskite $ABX_3$; a molar ratio of A to B to X in $ABX_3$ is 1:1:3; A is Cs, Rb or K; B is Pb, Sn, Ge, In, Ag, Bi, Sb, Zn, Ca or Ba; and X is Cl, Br or I.

In some embodiments, the fluorescent semiconductor nanocrystal material prepared by the method of the disclosure has a nanocrystal structure of halide $B'X_2$-modified perovskite $ABX_3$; a molar ratio of A to (B'+B) to X is 1:1:3; A is Cs, Rb or K; B' and B are different, and are independently selected from the group consisting of Pb, Sn, Ge, In, Ag, Bi, Sb, Zn, Ca and Ba; and X is Cl, Br or I.

In some embodiments, the fluorescent semiconductor nanocrystal material prepared by the method of the disclosure has a binary $D^{n+}Y^{n-}$ nanocrystal structure; n is an integer selected from 1-10; a molar ratio of D to Y in $D^{n+}Y^{n-}$ is 1:1; D is Zn, Cd, Hg, Pb, Sn, Ga, In, Ca, Ba, Cu, W or Mo, and Y is S, Se, Te, N, P, Sb or As.

In some embodiments, the fluorescent semiconductor nanocrystal material prepared by the method of the disclosure has a binary $D^{n+}Y^{n-}$ nanocrystal structure; n is an integer selected from 1-10; a molar ratio of D to Y in $D^{n+}Y^{n-}$ is 1:1; D is Zn, Cd or Hg, and Y is S, Se or Te.

In some embodiments, the fluorescent semiconductor nanocrystal material prepared by the method of the disclosure has a ternary IB-IIIA-VIA nanocrystal structure with a general formula of $G+M^{3+}(N^{2-})_2$, where $G^+$ is a monovalent cation of a IB group metal element; $M^{3+}$ is a trivalent cation of a IIIA group element; $N^{2-}$ is a divalent anion of a VIA group element; and a molar ratio of $G^+$ to $M^{3+}$ to $N^{2-}$ is 0.5:0.5:1.

In some embodiments, the fluorescent semiconductor nanocrystal material prepared by the method of the disclosure has a ternary IB-IIIA-VIA nanocrystal structure with a general formula of $G^+ M^{3+}(N^{2-})_2$, where $G^+$ is $Cu^+$ or $Ag^+$; $M^{3+}$ is $In^{3+}$, $Ga^{3+}$ or $Al^{3+}$; $N^{2-}$ is $S^{2-}$ or $Se^{2-}$; and a molar ratio of $G^+$ to $M^{3+}$ to $N^{2-}$ is 0.5:0.5:1.

In a third aspect, this application provides a light-emitting diode (LED) device, wherein the LED device comprises the fluorescent semiconductor nanocrystal material of this application.

In a fourth aspect, this application provides a color conversion display panel, wherein the color conversion display panel comprises the fluorescent semiconductor nanocrystal material of this application.

In a fifth aspect, this application provides a fluorescent scintillator, wherein the fluorescent scintillator is made of the fluorescent semiconductor nanocrystal material of this application.

In a sixth aspect, this application provides a biological detection device, wherein the biological detection device comprises the fluorescent semiconductor nanocrystal material of this application.

Compared to the existing commercial phosphor, the fluorescent material of this application has the advantages of narrow half-band width, high color purity, adjustable luminous range, strong water and heat resistance and good light stability. Moreover, the fluorescent material has no rare-earth materials, allowing for low cost.

DETAILED DESCRIPTION OF EMBODIMENTS

Figure 1A:
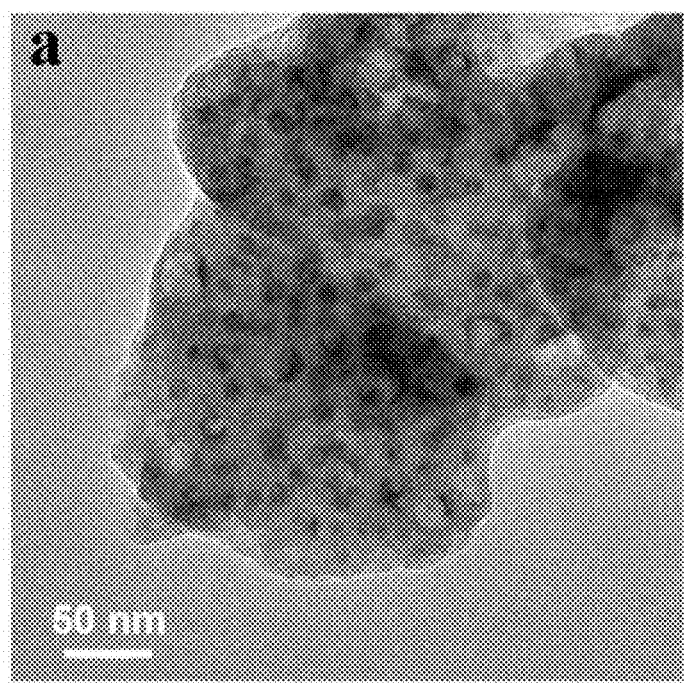
FIG. 1a is a Transmission Electron Microscopy (TEM) image of $CsPbBr_3$/mesoporous molecular sieve perovskite semiconductor nanocrystal fluorescent powder according to Example 1 of the disclosure.

In order to render the objects, technical solutions and beneficial effects of the disclosure clearer, the disclosure will be described below in detail in conjunction with embodiments. It should be understood that these embodiments are merely illustrative of the disclosure, and are not intended to limit the disclosure.

In this application, the fluorescent semiconductor nanocrystal material has a specific microscopic structure, and can exist in a variety of macroscopic forms, such as powder (semiconductor nanocrystal fluorescent powder) or film (semiconductor nanocrystal fluorescent film).

As used herein, the term "nanocrystallinenanocrystal precursor" refers to an existing form before the target nanocrystal is obtained.

In this application, the semiconductor nanocrystal precursor and the micro/mesoporous material are mixed uniformly and then calcined under the temperature higher than or equal to the collapse temperature of the micro/mesoporous material to prepare the fluorescent semiconductor nanocrystal material.

In this application, the semiconductor nanocrystal precursor is used as a raw material to prepare the semiconductor nanocrystal, and the selection of the semiconductor nanocrystal precursor depends on the structure of the desired semiconductor nanocrystal. If the desired semiconductor nanocrystal has a perovskite structure ABX$_3$, the semiconductor nanocrystal precursor can be selected from halides of a IA group element, a IIA group element, a B group element and a IIIA group element. In some embodiments, the semiconductor nanocrystal precursor is AX or BX$_2$, where A is selected from the group consisting of Cs, Rb, K, Ca, Sr, Ba and a combination thereof, preferably Cs, Rb, K or a combination thereof, and more preferably Cs, Rb or K; B is selected from the group consisting of Pb, Zn, Ca, Sr, Ba, Al, Ga, In, Ge, Sn, Cu, Mn, Sb, Bi, Ag and a combination thereof, preferably Pb, Zn, Ca, Sr, Ba, Sn, Cu, Mn, Sb, Bi or a combination thereof, and more preferably Pb, Sn, Zn, Ca or Ba; and X is selected from the group consisting of Cl, Br, I and a combination thereof, preferably Cl, Br or I. In some embodiments, the semiconductor nanocrystal precursor is a mixture of AX and BX$_2$.

In some embodiments, if the desired semiconductor nanocrystal has a binary structure D$^{n+}$Y$^{n-}$ (n is an integer selected from 1-10), the nanocrystal precursor consists of a cationic precursor for providing a cation D$^{n+}$ for a target nanocrystal and an anionic precursor for providing an anion Y$^{n-}$ for the target nanocrystal, where a molar ratio of the cationic precursor to the anionic precursor is 1:1; the cationic precursor is selected from the group consisting of hydrochloride, nitrate, sulfate, bisulfate, carbonate and bicarbonate of Zn, Cd, Hg, Pb, Sn, Ga, In, Ca, Ba, Cu, W and Mo, and hydrate thereof; and the anionic precursor is selected from the group consisting of simple substances and inorganic salts of S, Se, Te, N, P, Sb and As.

In some embodiments, if the desired semiconductor nanocrystal has a IB-IIIA-VIA ternary structure, the nanocrystal precursor consists of a first precursor for providing monovalent cation, a second precursor for providing trivalent cation and a third precursor for providing divalent anion. The first precursor is a compound of a IB group metal, preferably a halide of the IB group metal, such as chloride, bromide and iodide of the IB group metal; the second precursor is an organic acid salt of a IIIA group metal, such as formates, acetates and propionates of the IIIA group metal; and the third precursor is an inorganic salt consisting of a VIA group element and a metal element. A molar ratio of the first precursor to the second precursor to the third precursor is 0.5:0.5:1.

In some embodiment, the micro/mesoporous material is a microporous material, a mesoporous material or a combination thereof. In the practical application, the selection of the micro/mesoporous material depends on the size of the required pores. Considering the operation convenience and availability of the micro/mesoporous material, the pore size of the micro/mesoporous material is preferably 0.5-50 nm. Generally, the pore size of the microporous material is less than 2 nm, and the pore size of the mesoporous material is generally 2 nm-50 nm. Therefore, when the microporous material is used alone, it is preferable to use a microporous material with a pore size of 0.5-2 nm, and when the mesoporous material is used alone, it is preferable to use a mesoporous material with a pore size of 2-50 nm.

In some embodiments, the micro/mesoporous material is a mesoporous material, a microporous material or a combination thereof. The microporous material includes, but is not limited to, microporous molecular sieve, microporous silica, microporous titania, microporous alumina, microporous transition metal oxide, microporous sulfide, silicate, aluminate and transition metal nitride. The mesoporous material includes, but is not limited to, mesoporous molecular sieve, mesoporous silica, mesoporous titania, mesoporous alumina, mesoporous carbon, mesoporous transition metal oxide, mesoporous sulfide, silicate, aluminate and transition metal nitride.

The micro/mesoporous material has a property of collapsing under high temperature or high temperature and high pressure, such that it can firmly coat or encapsulate the precursor placed in the micropores or mesopores after collapsing.

In some embodiments, a weight ratio of the semiconductor nanocrystal precursor to the micro/mesoporous material is 1:0.05-20, preferably 1:0.5-10, and more preferably 1:1-5, and most preferably 1:3. The semiconductor nanocrystal fluorescent powder prepared under this weight ratio has long-term stable luminescence performance.

The semiconductor nanocrystal precursor and the micro/mesoporous material can be mixed by common liquid phase mixing or solid phase mixing.

In the liquid phase mixing, the semiconductor nanocrystal precursor is uniformly dispersed in a solvent (e.g., water) to make a precursor solution or suspension, to which the micro/mesoporous material is added. The system is fully stirred and dried (such as dried in a constant temperature drying oven for a period of time) to evaporate the solvent, so as to obtain a solid powder. The drying temperature is usually not higher than the boiling point of the solvent, for example, when ultrapure or pure water is used as the solvent, the drying is generally performed at 50-100° C. for 10-40 h. The obtained solid powder will be calcined to prepare the fluorescent semiconductor nanocrystal material. In the liquid phase mixing method, the selected solvent should not change the properties of the semiconductor nanocrystal precursor and the micro/mesoporous material. For example, pure water and common organic solvents can be selected. In addition, the solution or suspension can be stirred and/or appropriately heated in the dispersing process of the semiconductor nanocrystal precursor and/or the micro/mesoporous material in the solvent to enable the uniform dispersion.

In the solid phase mixing, the dry semiconductor nanocrystal precursor is directly mixed with the micro/mesoporous material, and ground to allow the semiconductor nanocrystal precursor to be embedded in the micro/mesoporous material to obtain a mixed powder. The mixed powder is calcined at high temperature to prepare the fluorescent semiconductor nanocrystal material. In some embodiments, an appropriate amount of organic solvent and/or surfactant can be added when the semiconductor nanocrystal precursor is mixed and ground with the micro/mesoporous material.

The lowest calcination temperature should enable the pores of the micro/mesoporous material to collapse. However, the collapse temperature of different micro/mesoporous materials is different, and the collapse temperature of different structures made of the same material is also different. Therefore, the calcination temperature must be higher than or equal to the lowest collapse temperature of the material. The minimum collapse temperature of the above-mentioned micro/mesoporous materials is 300° C. Most of the commonly used micro/mesoporous materials will experience a collapse at 300-2000° C. For example, mesoporous silica collapses at 600° C., and mesoporous titania begins to collapse at 800° C.

During calcination, it is preferable to gradually raise the temperature to the desired collapse temperature at a certain heating rate. The heating rate is generally 1-20° C./min, preferably 5-10° C./min. When the required collapse temperature is reached, in order to ensure the complete collapse to better package or coat the semiconductor nanocrystals, the calcination temperature is usually kept for 10-600 min, preferably 10-100 min, and more preferably 10-60 min.

After the calcination is completed, the calcined product is lowered to room temperature, and fully ground to obtain the fluorescent semiconductor nanocrystal material. Considering that there may be unstable semiconductor nanocrystals on the surface of the micro/mesoporous material, the method of this application may further includes a washing step to remove the unstable semiconductor nanocrystals from the surface of the micro/mesoporous material. For example, the unstable semiconductor nanocrystals on the surface of the micro/mesoporous material can be washed away by dispersing the ground nanocrystal fluorescent material in a solvent such as water, and the desired nanocrystal fluorescent material can be obtained after subjecting the dispersion liquid to post-processing such as centrifugation and drying.

The fluorescent semiconductor nanocrystal material of this application has a wide application range. For example, the fluorescent semiconductor nanocrystal material can be used in the field of LED device. Specifically, the light-emitting surface of the LED chip is coated with the powder or film of the fluorescent semiconductor nanocrystal material, which can enhance the light-emitting stability of the LED device. The semiconductor nanocrystal fluorescent material can also be used in the field of color conversion panels. Specifically, at least two different semiconductor nanocrystals can be present on the color conversion panel to display different colors by using the color conversion layer made of the fluorescent material of this application. Furthermore, the color conversion panel can also be applied in the field of display. Corresponding colors can be presented on the display panel based on the several color conversion layers. The fluorescent semiconductor nanocrystal material can also be used as a scintillator in the radiation detection, where the fluorescent semiconductor nanocrystal material can absorb radiation, such as α-rays, β-rays, γ-rays and X-rays, to emit fluorescence. A combination of a scintillator and a photodiode that detects fluorescence can be used to detect emitted radiation. For example, it may be used in the medical field such as computed tomography (CT), industrial field such as non-destructive inspection, security field such as baggage inspection, and academic field such as high-energy physics. Moreover, the fluorescent material of this application can be used as a fluorescent substance in the biological detection, or used as a fluorescent marker for in-vitro and in-vivo fluorescent imaging.

The disclosure will be further described below in detail with reference to the embodiments.

Example 1 Preparation of Mesoporous Molecular Sieve-Encapsulated $CsPbBr_3$ (Perovskite Structure $ABX_3$) Semiconductor Nanocrystal Fluorescent Powder (1) 0.6 mmol of a precursor CsBr (127.7 mg) and 0.6 mmol of a precursor $PbBr_2$ (221.4 mg) were dissolved in 50 mL of ultrapure water and stirred constantly to form a clear solution.

(2) 1047.3 mg (i.e., a weight ratio of the mesoporous molecular sieve to the sum of the CsBr and $PbBr_2$ was 3:1) of a mesoporous molecular sieve with a pore size of 3.6 nm was added into the above clear solution followed by stirring at 60° C. for 30 min to form a mixed solution.

(3) The mixed solution was dried in a constant temperature drying oven at 100° C. for 12 h to obtain a solid powder.

(4) The solid powder was spread evenly into a corundum crucible, and then the corundum crucible was transferred to a high-temperature furnace.

(5) The corundum crucible was heated to 700° C. at a heating rate of 5° C./min, maintained at 700° C. for 30 min and taken out after naturally cooling to room temperature.

(6) The obtained product was ground fully and then dispersed in 50 mL of water to wash away the unstable perovskite semiconductor nanocrystals on the surface of the molecular sieve. The dispersion was centrifuged at 10,000 rpm three times each for 1 min, and the obtained precipitate was dried in the constant temperature drying ovenoven at 60° C. for 6 h to obtain $CsPbBr_3$/mesoporous molecular sieve semiconductor nanocrystal fluorescent powder.

Figure 1B:
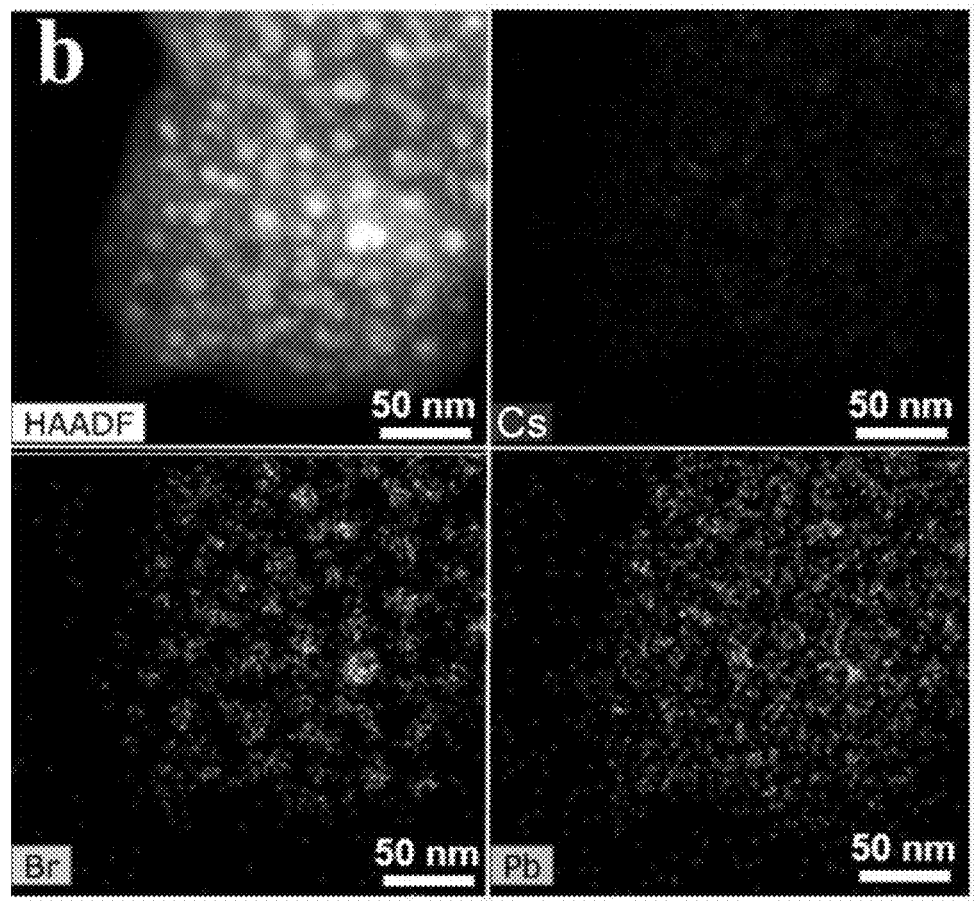
FIG. 1b is a mapping picture of a CsPbBr$_3$ nanocrystal according to Example 1 of the disclosure.
Figure 2:
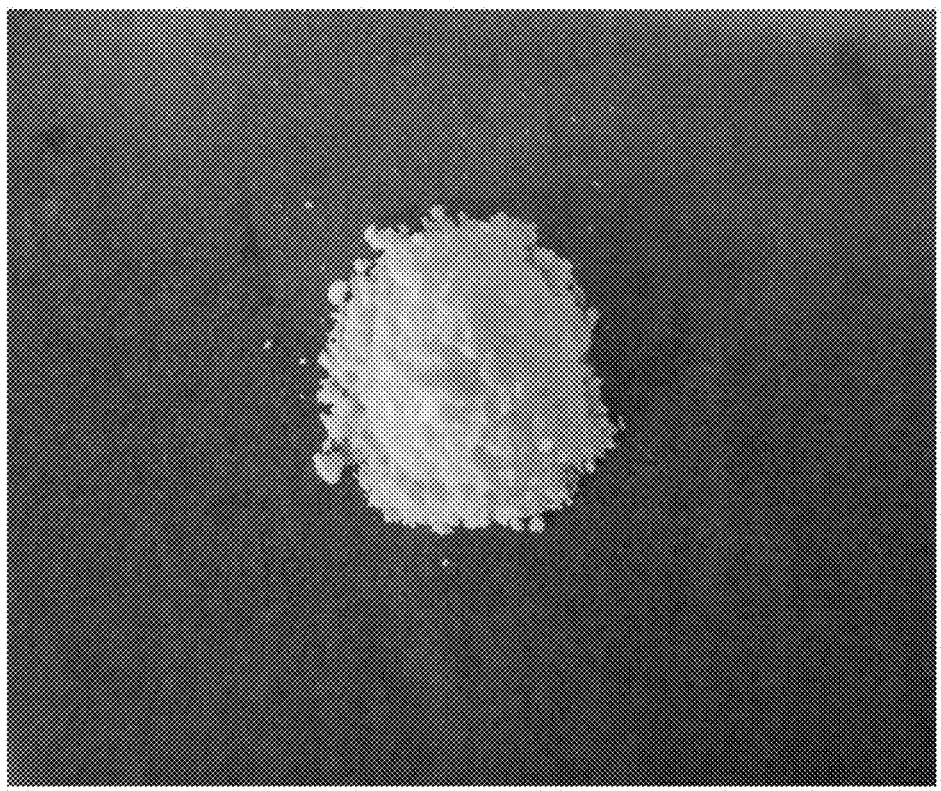
FIG. 2 is an optical photograph of the CsPbBr$_3$/mesoporous molecular sieve perovskite semiconductor nanocrystal fluorescent powder (yellow powder) according to Example 1 of the disclosure.
Figure 3:
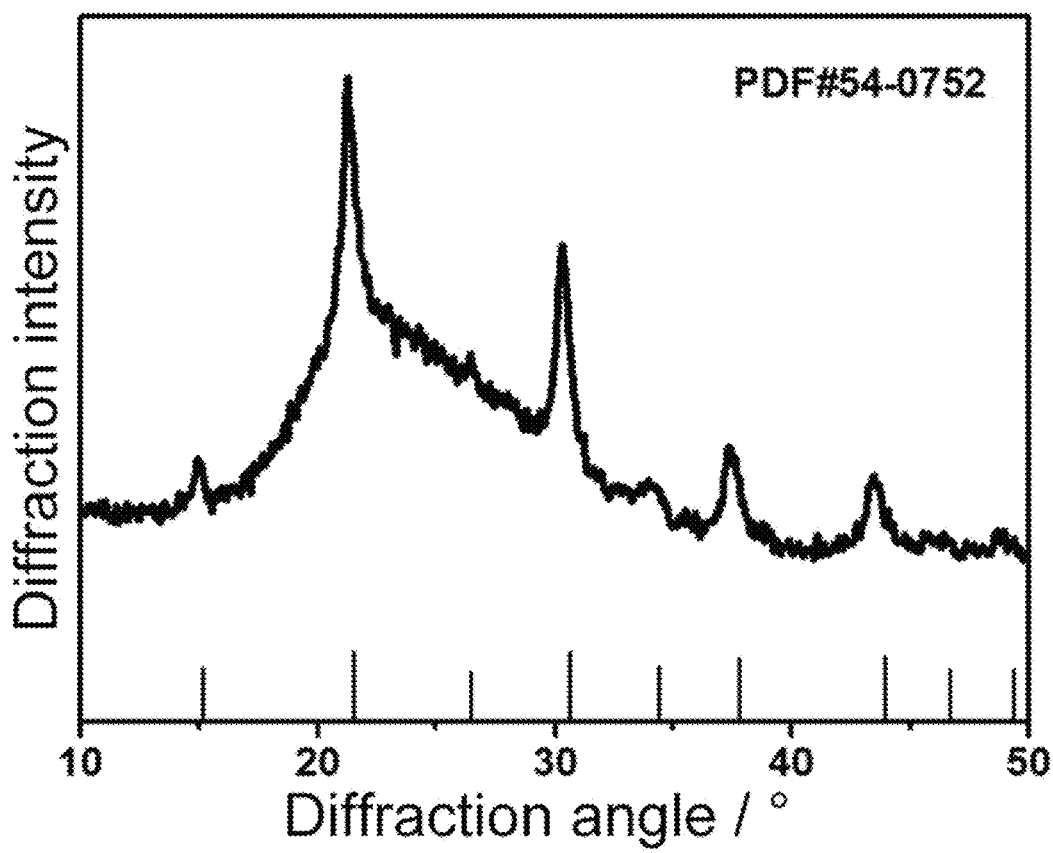
FIG. 3 is a XRD pattern of the CsPbBr$_3$/mesoporous molecular sieve perovskite semiconductor nanocrystal fluorescent powder according to Example 1 of the disclosure.
Figure 4:
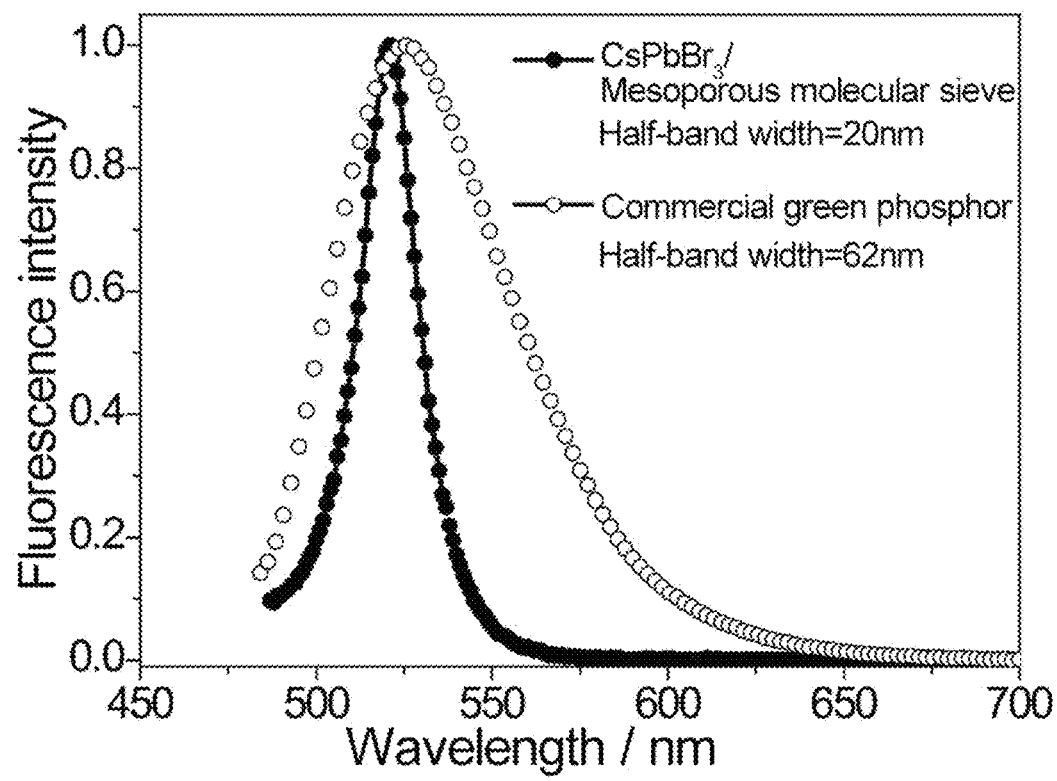
FIG. 4 schematically shows comparison between the CsPbBr$_3$/mesoporous molecular sieve perovskite semiconductor nanocrystal fluorescent powder according to Example 1 and a commercial-available green phosphor in terms of photoluminescence.
Figure 5:
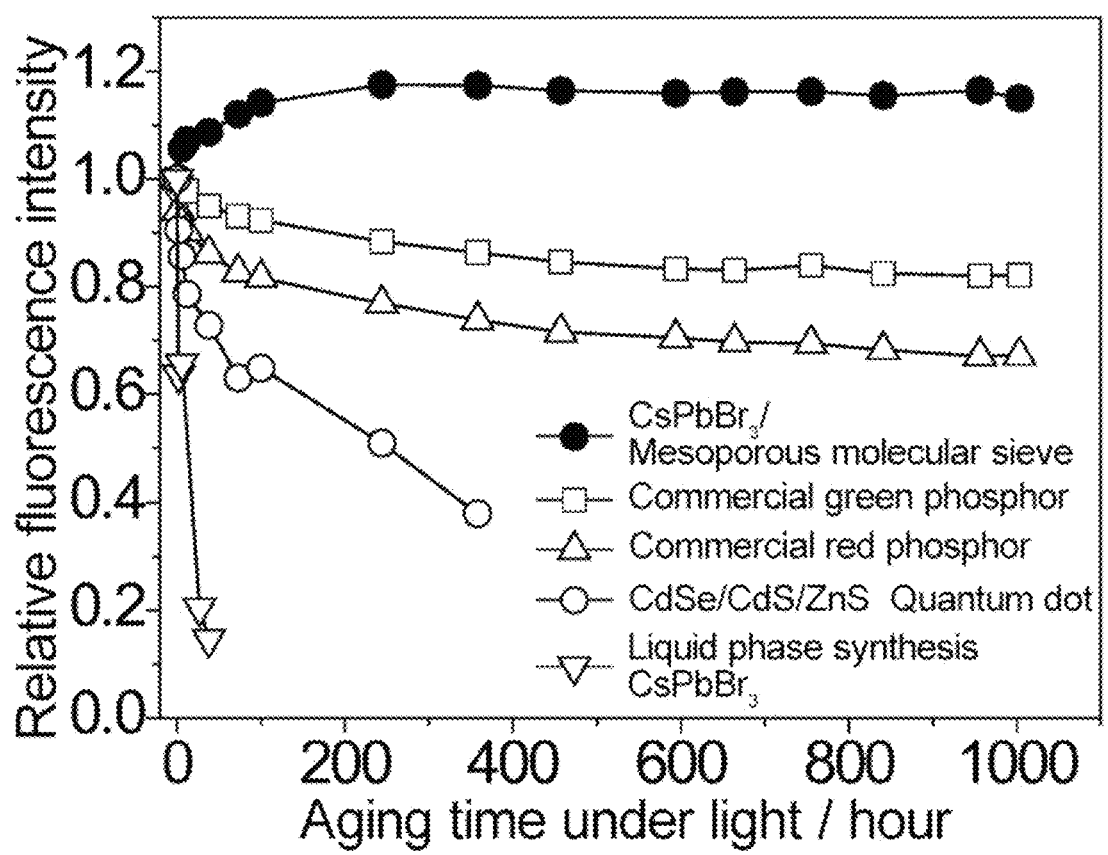
FIG. 5 schematically shows stability comparison between the CsPbBr$_3$/mesoporous molecular sieve perovskite semiconductor nanocrystal fluorescent powder according to Example 1 and other fluorescent powders and semiconductor nanocrystals in a light aging test under a 20 mA current.
Figure 6:
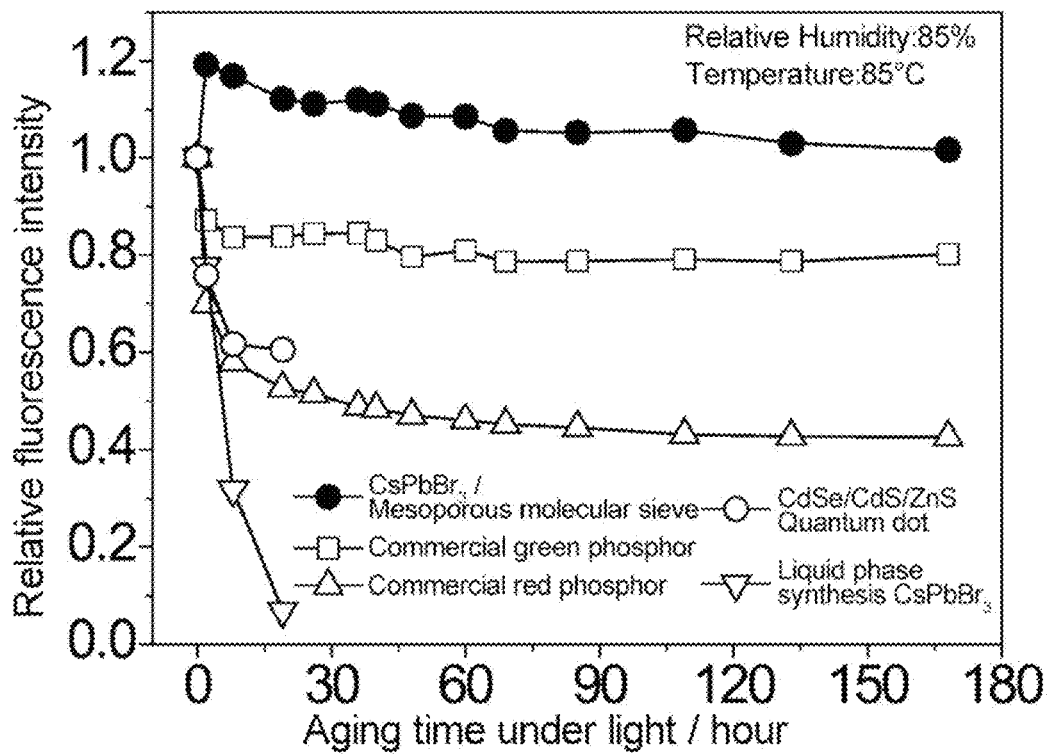
FIG. 6 schematically shows stability comparison between the CsPbBr$_3$/mesoporous molecular sieve perovskite semiconductor nanocrystal fluorescent powder according to Example 1 and other fluorescent powders and semiconductor nanocrystals in a light aging test under a 20 mA current at 85° C. and a relative humidity of 85%.

The $CsPbBr_3$/mesoporous molecular sieve semiconductor nanocrystal fluorescent powder prepared in Example 1 was subjected to TEM analysis, XRD analysis, and photoluminescence attenuation test. As shown in the TEM image of the $CsPbBr_3$/mesoporous molecular sieve perovskite semiconductor nanocrystal fluorescent powder in FIG. 1a, it can be seen that the perovskite semiconductor nanocrystal had uniform size distribution with an average particle size of about 9.5 nm. FIG. 1b was the mapping picture of $CsPbBr_3$ nanocrystals, from which it can be observed that the Cs, Pb and Br were mainly concentrated on the $CsPbBr_3$ nanocrystal particles. As shown in FIG. 2, the $CsPbBr_3$/mesoporous molecular sieve perovskite semiconductor nanocrystal fluorescent powder was yellow (cannot be seen due to the gray processing). As shown in the XRD pattern of the $CsPbBr_3$/mesoporous molecular sieve perovskite semiconductor nanocrystal fluorescent powder in FIG. 3, it can be known that the obtained semiconductor nanocrystal exhibited a cubic perovskite structure (the corresponding PDF card was #54-0752), which fully proved that $CsPbBr_3$ nanocrystals were formed after the high-temperature calcination. FIG. 4 schematically showed comparison between the $CsPbBr_3$/mesoporous molecular sieve perovskite semiconductor nanocrystal fluorescent powder and a commercially-available green phosphor in terms of photoluminescence, where the green phosphor was manufactured by Intermtix Corporation (Silicon Valley, California, USA), and had achieved great commercial application due to its good stability, low cost and high fluorescence efficiency. It can be seen from FIG. 4 that the half-band width of the perovskite semiconductor nanocrystal fluorescent powder obtained herein was as narrow as 20 nm, which was much lower than that of the commercial silicate green phosphor (the half-band width was 62 nm). By contrast, the perovskite semiconductor nanocrystal fluorescent powder obtained in this embodiment had great application potential. FIG. 5 schematically showed comparison of light attenuation between the $CsPbBr_3$/mesoporous molecular sieve perovskite semiconductor nanocrystal fluorescent powder and other phosphors and semiconductor nanocrystals in the presence of 20 mA current under the exposure to light. The $CsPbBr_3$/mesoporous molecular sieve perovskite semiconductor nanocrystal fluorescent powder prepared in this example did not exhibit fluorescence decay after 1000 h radiation, while the fluorescence intensity of the commercial green phosphor had been reduced to 82% of the original fluorescence intensity. At the same time, the fluorescence intensity of the $CsPbBr_3$ prepared by liquid phase synthesis (see Comparative Example 1) experienced an extremely fast decay, which also indicated that the stability of the semiconductor nanocrystal fluorescent powder of this application was very excellent. FIG. 6 schematically showed stability comparison between the $CsPbBr_3$/mesoporous molecular sieve perovskite semiconductor nanocrystal fluorescent powder and other phosphors and semiconductor nanocrystals in a light aging test under a 20 mA current at 85° C. and a relative humidity of 85%. It can be seen that the perovskite semiconductor nanocrystal fluorescent powder had no fluorescence decay phenomenon after aging 168 h under high temperature and high humidity, and exhibited excellent water resistance and heat resistance. This further proved the excellent stability of the $CsPbBr_3$/mesoporous molecular sieve perovskite semiconductor nanocrystal fluorescent powder.

Figure 7A:
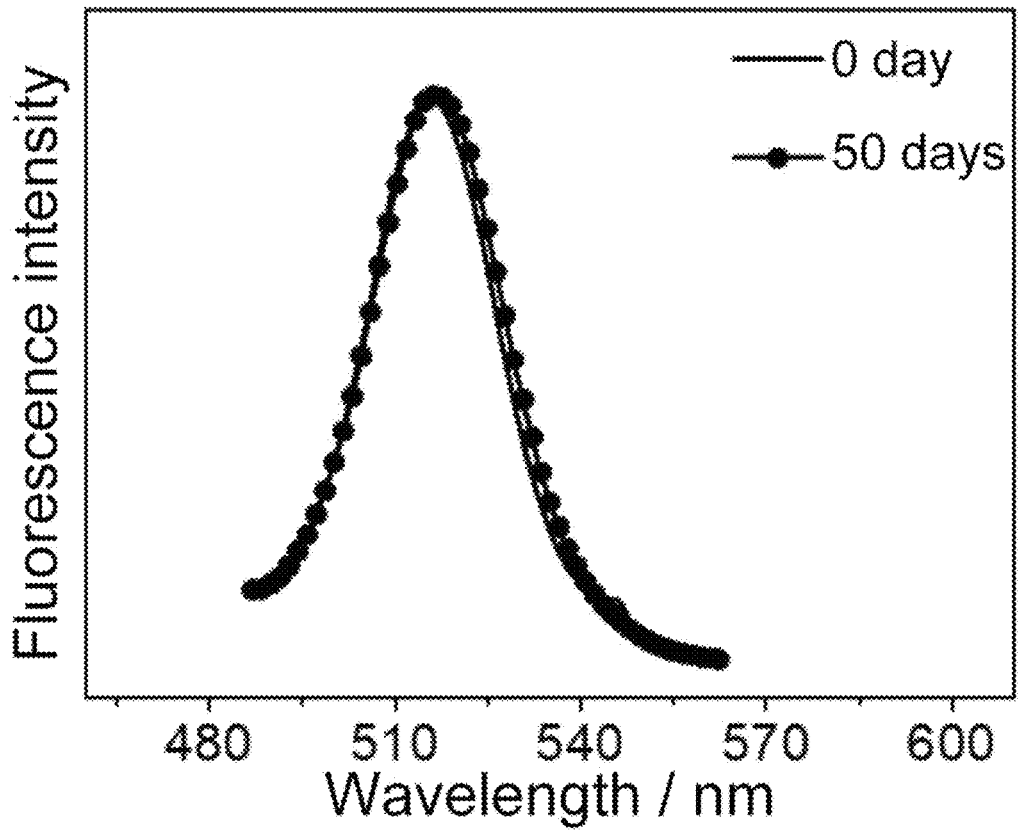
FIG. 7a shows fluorescence change of the CsPbBr$_3$/mesoporous molecular sieve perovskite semiconductor nanocrystal fluorescent powder according to Example 1 after immersed in a 1 mol/L hydrochloric acid solution for 50 days.
Figure 7B:
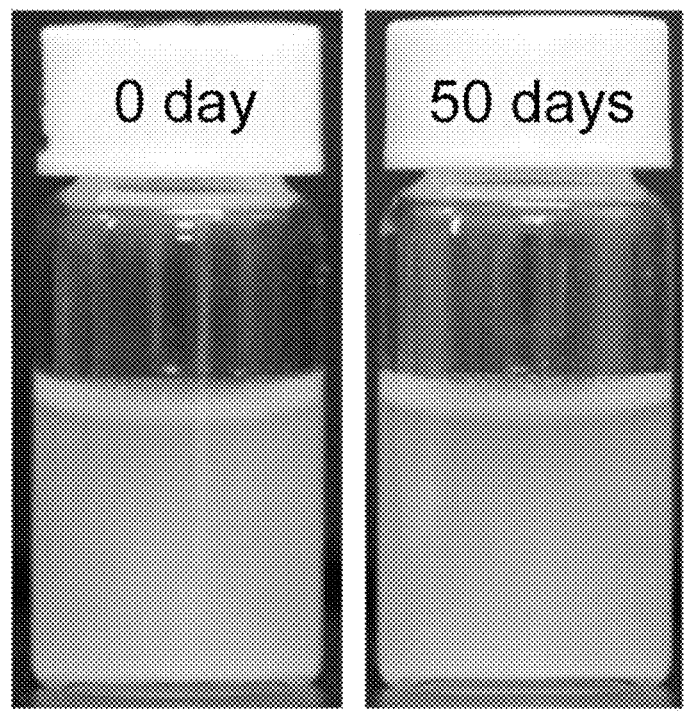
FIG. 7b is optical photographs of the CsPbBr$_3$/mesoporous molecular sieve perovskite semiconductor nanocrystal fluorescent powder according to Example 1 after immersed in a 1 mol/L hydrochloric acid solution for 0 day and 50 days, respectively.

FIG. 7a showed fluorescence change of the $CsPbBr_3$/mesoporous molecular sieve semiconductor nanocrystal fluorescent powder after immersed in a 1 mol/L hydrochloric acid solution for 50 days, and there was no fluorescence decay phenomenon. This further confirmed that the $CsPbBr_3$/mesoporous molecular sieve semiconductor nanocrystal fluorescent powder prepared in this embodiment exhibited excellent light and thermal stability.

It has also been found that in the preparation of the fluorescent semiconductor nanocrystal material, when a weight ratio of the semiconductor nanocrystal precursor to the micro/mesoporous material was 1:0.05-20, the prepared semiconductor nanocrystal fluorescent materials all exhibited high stability. Examples 2 and 3 described preparations of the semiconductor nanocrystal fluorescent powder, which were different in the weight ratio of the semiconductor nanocrystal precursor to the micro/mesoporous material.

Example 2 Preparation of Mesoporous Molecular Sieve-Encapsulated CsPbBr$_3$ (Perovskite Structure ABX$_3$) Semiconductor Nanocrystal Fluorescent Powder (1) 0.6 mmol of a precursor CsBr (127.7 mg) and 0.6 mmol of a precursor PbBr$_2$ (221.4 mg) were dissolved in 50 mL of ultrapure water and stirred constantly to form a clear solution.
(2) 3491.0 mg (i.e., a weight ratio of the mesoporous molecular sieve to the sum of the CsBr and PbBr$_2$ was 10:1) of a mesoporous molecular sieve with a pore size of 3.6 nm was added into the above clear solution followed by stirring at 60° C. for 30 min to form a mixed solution.
(3) The mixed solution was dried in a constant temperature drying oven at 100° C. for 12 h to obtain a solid powder.
(4) The solid powder was spread evenly into a corundum crucible, and then the corundum crucible was transferred to a high-temperature furnace.
(5) The corundum crucible was heated to 700° C. at a heating rate of 5° C./min, maintained at 700° C. for 30 min and taken out after naturally cooling to room temperature.
(6) The obtained product was ground fully and then dispersed in 50 mL of water to wash away the unstable perovskite semiconductor nanocrystals on the surface of the molecular sieve. The dispersion was centrifuged at 10,000 rpm three times each for 1 min, and the obtained precipitate was dried in the constant temperature drying ovenoven at 60° C. for 6 h to obtain CsPbBr$_3$/mesoporous molecular sieve semiconductor nanocrystal fluorescent powder.

Example 3 Preparation of Mesoporous Molecular Sieve-Encapsulated CsPbBr$_3$ (Perovskite Structure ABX$_3$) Semiconductor Nanocrystal Fluorescent Powder (1) 0.6 mmol of a precursor CsBr (127.7 mg) and 0.6 mmol of a precursor PbBr$_2$ (221.4 mg) were dissolved in 50 mL of ultrapure water and stirred constantly to form a clear solution.
(2) 34.9 mg (i.e., a weight ratio of the mesoporous molecular sieve to the sum of the CsBr and PbBr$_2$ was 0.1:1) of a mesoporous molecular sieve with a pore size of 3.6 nm was added into the above clear solution followed by stirring at 60° C. for 30 min to form a mixed solution.
(3) The mixed solution was dried in a constant temperature drying oven at 100° C. for 12 h to obtain a solid powder.
(4) The solid powder was spread evenly into a corundum crucible, and then the corundum crucible was transferred to a high-temperature furnace.
(5) The corundum crucible was heated to 700° C. at a heating rate of 5° C./min, maintained at 700° C. for 30 min and taken out after naturally cooling to room temperature.
(6) The obtained product was ground fully and then dispersed in 50 mL of water to wash away the unstable perovskite semiconductor nanocrystals on the surface of the molecular sieve. The dispersion was centrifuged at 10,000 rpm three times each for 1 min, and the obtained precipitate was dried in the constant temperature drying ovenoven at 60° C. for 6 h to obtain CsPbBr$_3$/mesoporous molecular sieve semiconductor nanocrystal fluorescent powder.

Example 4 Preparation of Microporous Molecular Sieve-Encapsulated CsPbBr$_3$ Semiconductor Nanocrystal Fluorescent Powder (1) 0.6 mmol of a precursor CsBr (127.7 mg) and 0.6 mmol of a precursor PbBr$_2$ (221.4 mg) were dissolved in 50 mL of ultrapure water and stirred constantly to form a clear solution.
(2) 1047.3 mg (i.e., a weight ratio of the mesoporous molecular sieve to the sum of the CsBr and PbBr$_2$ was 3:1) of a microporous molecular sieves with a pore size of 1.0 nm was added into the above clear solution followed by stirring at 60° C. for 30 min to form a mixed solution.
(3) The mixed solution was dried in a constant temperature drying oven at 100° C. for 12 h to obtain a solid powder.
(4) The solid powder was spread evenly into a corundum crucible, and then the corundum crucible was transferred to a high-temperature furnace.
(5) The corundum crucible was heated to 700° C. at a heating rate of 5° C./min, maintained at 700° C. for 30 min and taken out after naturally cooling down to room temperature.
(6) The obtained product was ground fully and then dispersed in 50 mL of water to wash away the unstable perovskite semiconductor nanocrystals on the surface of the molecular sieve. The dispersion was centrifuged at 10,000 rpm three times each for 1 min, and the obtained precipitate was dried in the constant temperature drying ovenoven at 60° C. for 6 h to obtain CsPbBr$_3$/microporous molecular sieve semiconductor nanocrystal fluorescent powder.

Example 5 Preparation of Mesoporous Silica-Encapsulated CsPbBr$_3$ Semiconductor Nanocrystal Fluorescent Powder (1) 0.6 mmol of aprecursor CsBr (127.7 mg) and 0.6 mmol of a precursor PbBr$_2$ (221.4 mg) were dissolved in 50 mL of ultrapure water and stirred constantly to form a clear solution.
(2) 1047.3 mg (i.e., a weight ratio of the mesoporous silica to the sum of the CsBr and PbBr$_2$ was 3:1) of a mesoporous silica with a pore size of 3.6 nm was added into the above clear solution followed by stirring at 60° C. for 30 min to form a mixed solution.
(3) The mixed solution was dried in a constant temperature drying oven at 100° C. for 12 h to obtain a solid powder.
(4) The solid powder was spread evenly into a corundum crucible, and then the corundum crucible was transferred to a high-temperature furnace.
(5) The corundum crucible was heated to 700° C. at a heating rate of 5° C./min, maintained at 700° C. for 30 min and taken out after naturally cooling to room temperature.
(6) The obtained product was ground fully and then dispersed in 50 mL of water to wash away the unstable perovskite semiconductor nanocrystals on the surface of the molecular sieve. The dispersion was centrifuged at 10,000 rpm three times each for 1 min, and the obtained precipitate was dried in the constant temperature drying oven at 60° C. for 6 h to obtain CsPbBr$_3$/mesoporous silica semiconductor nanocrystal fluorescent powder.

Example 6 Preparation of Microporous Silica-Encapsulated CsPbBr$_3$ Semiconductor Nanocrystal Fluorescent Powder (1) 0.6 mmol of a precursor CsBr (127.7 mg) and 0.6 mmol of a precursor PbBr$_2$ (221.4 mg) were dissolved in 50 mL of ultrapure water and stirred constantly to form a clear solution.
(2) 1047.3 mg (i.e., a weight ratio of the microporous silica to the sum of the CsBr and PbBr$_2$ was 3:1) of a microporous silica with a pore size of 3.6 nm was added into the above clear solution followed by stirring at 60° C. for 30 min to form a mixed solution.
(3) The mixed solution was dried in a constant temperature drying oven at 100° C. for 12 h to obtain a solid powder.
(4) The solid powder was spread evenly into a corundum crucible, and then the corundum crucible was transferred to a high-temperature furnace.
(5) The corundum crucible was heated to 700° C. at a heating rate of 5° C./min and maintained at 700° C. for 30 min and taken out after naturally cooling to room temperature.
(6) The obtained product was ground fully and then dispersed in 50 mL of water to wash away the unstable perovskite semiconductor nanocrystals on the surface of the molecular sieve. The dispersion was centrifuged at 10,000 rpm three times each for 1 min, and the obtained precipitate was dried in the constant temperature drying oven at 60° C. for 6 h to obtain CsPbBr$_3$/microporous silica semiconductor nanocrystal fluorescent powder.

Example 7 Preparation of Mesoporous Molecular Sieve-Encapsulated ZnBr$_2$-Modified CsPbBr$_3$ Semiconductor Nanocrystal Fluorescent Powder (1) 0.6 mmol of a precursor CsBr (127.7 mg), 0.3 mmol of a precursor PbBr$_2$ (110.7 mg) and 0.3 mmol of a precursor ZnBr$_2$ (67.6 mg) were dissolved in 50 mL of ultrapure water and stirred constantly to form a clear solution.
(2) 917.9 mg (i.e., a weight ratio of the mesoporous molecular sieve to the sum of the CsBr, PbBr$_2$ and ZnBr$_2$ was 3:1) of a mesoporous molecular sieves with a pore size of 3.6 nm was added into the above clear solution followed by stirring at 60° C. for 30 min to form a mixed solution.
(3) The mixed solution was dried in a constant temperature drying oven at 100° C. for 12 h to obtain a solid powder.
(4) The solid powder was spread evenly into a corundum crucible, and then the corundum crucible was transferred to a high-temperature furnace.
(5) The corundum crucible was heated to 700° C. at a heating rate of 5° C./min, maintained at 700° C. for 30 min and taken out after naturally cooling to room temperature.
(6) The obtained product was ground fully and then dispersed in 50 mL of water to wash away the unstable perovskite semiconductor nanocrystals on the surface of the molecular sieve. The dispersion was centrifuged at 10,000 rpm three times each for 1 min, and the obtained precipitate was dried in the constant temperature drying oven at 60° C. for 6 h to obtain ZnBr$_2$—CsPbBr$_3$/mesoporous molecular sieves semiconductor nanocrystal fluorescent powder.

Figure 8:
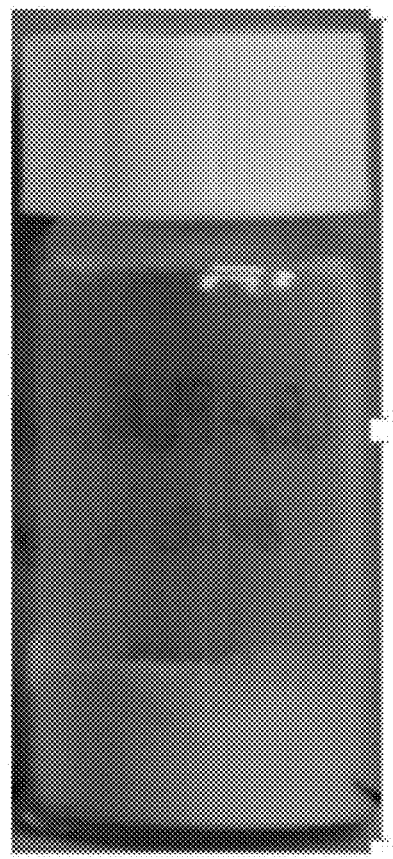
FIG. 8 is an optical photograph of a ZnBr$_2$-modified CsPbBr$_3$/mesoporous molecular sieve perovskite semiconductor nanocrystal fluorescent powder according to Example 7 of the disclosure.

As shown in the optical photograph of the ZnBr$_2$-modified CsPbBr$_3$/mesoporous molecular sieve perovskite semiconductor nanocrystal fluorescent powder in FIG. 8, the ZnBr$_2$-modified CsPbBr$_3$/mesoporous molecular sieve perovskite semiconductor nanocrystal fluorescent powder was in a form of orange yellow powder (the orange yellow is not visible in FIG. 8 due to the grayscale photo).

Example 8 Preparation of Mesoporous Molecular Sieve-Encapsulated CaBr$_2$-Modified CsPbBr$_3$ Semiconductor Nanocrystal Fluorescent Powder (1) 0.6 mmol of a precursor CsBr (127.7 mg), 0.3 mmol of a precursor PbBr$_2$ (110.7 mg) and 0.3 mmol of a precursor CaBr$_2$ (60.0 mg) were dissolved in 50 mL of ultrapure water and stirred constantly to form a clear solution.
(2) 895.1 mg (i.e., a weight ratio of the mesoporous molecular sieve to the sum of the CsBr, PbBr$_2$ and CaBr$_2$ was 3:1) of mesoporous molecular sieve with a pore size of 3.6 nm was added into the above clear solution followed by stirring at 60° C. for 30 min to form a mixed solution.
(3) The mixed solution was dried in a constant temperature drying oven at 100° C. for 12 h to obtain a solid powder.
(4) The solid powder was spread evenly into a corundum crucible, and then the corundum crucible was transferred to a high-temperature furnace.
(5) The corundum crucible was heated to 700° C. at a heating rate of 5° C./min, maintained at 700° C. for 30 min and taken out after naturally cooling to room temperature.
(6) The obtained product was ground fully and then dispersed in 50 mL of water to wash away the unstable perovskite semiconductor nanocrystals on the surface of the molecular sieve. The dispersion was centrifuged at 10,000 rpm three times each for 1 min, and the obtained precipitate was dried in the constant temperature drying oven at 60° C. for 6 h to obtain CaBr$_2$—CsPbBr$_3$/mesoporous molecular sieves semiconductor nanocrystal fluorescent powder.

Figure 9:
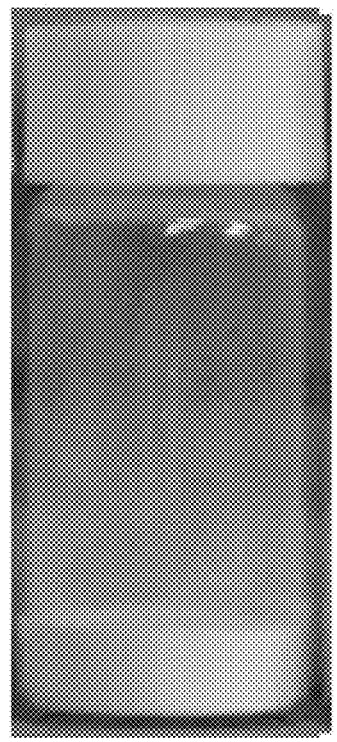
FIG. 9 is an optical photograph of a CaBr$_2$-modified CsPbBr$_3$/mesoporous molecular sieve perovskite semiconductor nanocrystal fluorescent powder according to Example 8 of the disclosure.

As shown in the optical photograph of the CaBr$_2$—CsPbBr$_3$/mesoporous molecular sieve perovskite semiconductor nanocrystal fluorescent powder in FIG. 9, the CaBr$_2$—CsPbBr$_3$/mesoporous molecular sieve perovskite semiconductor nanocrystal fluorescent powderwas in a form of grayish white powder.

Example 9 Preparation of Mesoporous Molecular Sieve-Encapsulated BaBr$_2$ Modified CsPbBr$_3$ Semiconductor Nanocrystal Fluorescent Powder (1) 0.6 mmol of a precursor CsBr (127.7 mg), 0.3 mmol of a precursor PbBr$_2$ (110.7 mg) and 0.3 mmol of a precursor BaBr$_2$ (89.1 mg) were dissolved in 50 mL of ultrapure water and stirred constantly to form a clear solution.
(2) 982.6 mg (i.e., a weight ratio of the mesoporous molecular sieve to the sum of the CsBr, PbBr$_2$ and BaBr$_2$ was 3:1) of a mesoporous molecular sieves with a pore size of 3.6 nm was added into the above clear solution followed by stirring at 60° C. for 30 min to form a mixed solution.
(3) The mixed solution was dried in a constant temperature drying oven at 100° C. for 12 h to obtain a solid powder.
(4) The solid powder was spread evenly into a corundum crucible, and then the corundum crucible was transferred to a high-temperature furnace.
(5) The corundum crucible was heated to 700° C. at a heating rate of 5° C./min, maintained at 700° C. for 30 min and taken out after naturally cooling to room temperature.
(6) The obtained product was ground fully and then dispersed in 50 mL of water to wash away the unstable perovskite semiconductor nanocrystals on the surface of the molecular sieve. The dispersion was centrifuged at 10,000 rpm three times each for 1 min, and the obtained precipitate was dried in the constant temperature drying ovenoven at 60° C. for 6 h to obtain $BaBr_2$—$CsPbBr_3$/mesoporous molecular sieves semiconductor nanocrystal fluorescent powder.

Figure 10:
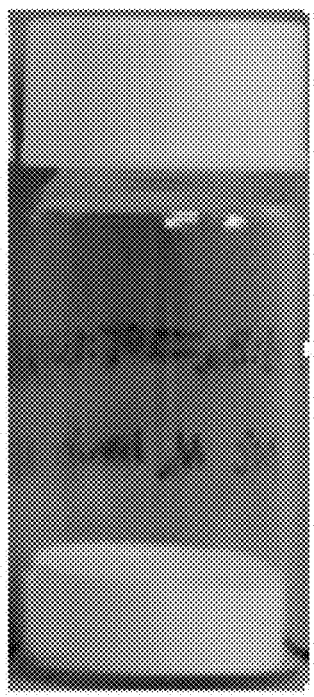
FIG. 10 is an optical photograph of a BaBr$_2$-modified CsPbBr$_3$/mesoporous molecular sieve perovskite semiconductor nanocrystal fluorescent powder according to Example 9 of the disclosure.

As shown in the optical photograph of the $BaBr_2$—$CsPbBr_3$/mesoporous molecular sieve perovskite semiconductor nanocrystal fluorescent powder in FIG. 10, the $BaBr_2$—$CsPbBr_3$/mesoporous molecular sieve perovskite semiconductor nanocrystal fluorescent powder was in a form of light yellow powder (the light yellow is not visible in FIG. 10 due to the grayscale photo).

Example 10 Preparation of Mesoporous Molecular Sieve-Encapsulated $CsPbBr_3$ (Perovskite $ABX_3$) Nanocrystal Fluorescent Powder (1) 0.6 mmol of a precursor CsBr (127.7 mg) and 0.6 mmol of a precursor $PbBr_2$ (221.4 mg) were mixed with 1047.3 mg (i.e., a weight ratio of the mesoporous molecular sieve to the sum of the CsBr and $PbBr_2$ was 3:1) of mesoporous molecular sieve with a pore size of 3.6 nm, the mixture was ground at room temperature for 1 h to form a mixed powder of the precursor and the mesoporous molecular sieve. The mixed powders were then spread evenly into a corundum crucible, and then the corundum crucible was transferred to a high-temperature furnace.
(2) The corundum crucible was heated to 700° C. at a heating rate of 5° C./min, maintained at 700° C. for 30 min and taken out after naturally cooling to room temperature.
(3) The obtained product was ground fully and then dispersed in 50 mL of water to wash away the unstable perovskite semiconductor nanocrystals on the surface of the molecular sieve. The dispersion was centrifuged at 10,000 rpm three times each for 1 min, and the obtained precipitate was dried in the constant temperature drying oven at 60° C. for 6 h to obtain $CsPbBr_3$/mesoporous molecular sieve nanocrystal fluorescent powder.

Example 11 Preparation of Mesoporous Molecular Sieve-Encapsulated $CsSnBr_3$ (Perovskite $ABX_3$) Semiconductor Nanocrystal Fluorescent Powder (1) 0.6 mmol of a precursor CsBr (127.7 mg) and 0.6 mmol of a precursor $SnBr_2$ (167.1 mg) were dissolved in 50 mL of ultrapure water and stirred constantly to form a clear solution.
(2) 884.8 mg (i.e., a weight ratio of the mesoporous molecular sieve to the sum of the CsBr and $SnBr_2$ was 3:1) of mesoporous molecular sieve with a pore size of 3.6 nm was added into the above clear solution followed by stirring at 60° C. for 30 min to form a mixed solution.
(3) The mixed solution was dried in a constant temperature drying oven at 100° C. for 12 h to obtain a solid powder.
(4) The solid powder was spread evenly into a corundum crucible, and then the corundum crucible was transferred to a high-temperature furnace.
(5) The corundum crucible was heated to 700° C. at a heating rate of 5° C./min, maintained at 700° C. for 30 min and taken out after naturally cooling to room temperature.
(6) The obtained product was ground fully and then dispersed in 50 mL of water to wash away the unstable perovskite semiconductor nanocrystals on the surface of the molecular sieve. The dispersion was centrifuged at 10,000 rpm three times each for 1 min, and the obtained precipitate was dried in the constant temperature drying oven at 60° C. for 6 h to obtain $CsSnBr_3$/mesoporous molecular sieve semiconductor nanocrystal fluorescent powder.

Example 12 Preparation of Mesoporous Molecular Sieve-Encapsulated CdSe (Binary Structure) Nanocrystal Fluorescent Powder (1) 1.0 mmol of a precursor $CdCl_2$ (183.8 mg) and 1.0 mmol of a precursor Se powder (78.9 mg) were dissolved in 50 mL of ultrapure water and stirred constantly to form a clear solution.
(2) 786.6 mg (i.e., a weight ratio of the mesoporous molecular sieve to the sum of the $CdCl_2$ and Se was 3:1) of a mesoporous molecular sieve with a pore size of 3.6 nm) was added into the above clear solution followed by stirring at 60° C. for 30 min to form a mixed solution.
(3) The mixed solution was dried in a constant temperature drying oven at 100° C. for 12 h to obtain a solid powder.
(4) The solid powder was spread evenly into a corundum crucible, and then the corundum crucible was transferred to a high-temperature furnace.
(5) The corundum crucible was heated to 700° C. at a heating rate of 5° C./min, maintained at 700° C. for 30 min and taken out after naturally cooling to room temperature.
(6) The obtained product was ground fully and then dispersed in 50 mL of water to wash away the unstable semiconductor nanocrystals on the surface of the molecular sieve. The dispersion was centrifuged at 10,000 rpm three times each for 1 min, and the obtained precipitate was dried in the constant temperature drying oven at 60° C. for 6 h to obtain CdSe/mesoporous molecular sieve semiconductor nanocrystal fluorescent powder.

Figure 11A:
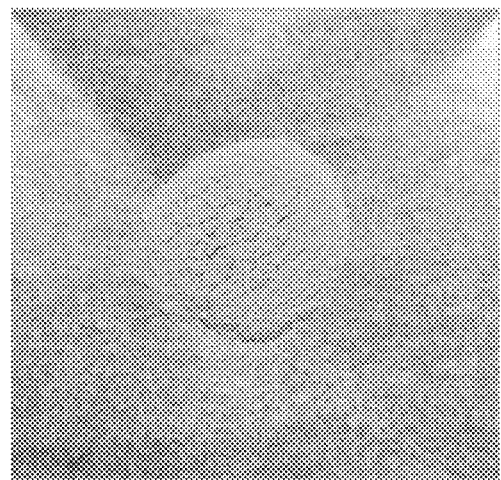
FIG. 11a is an optical photograph of a CdSe/mesoporous molecular sieve nanocrystal fluorescent powder according to Example 12 of the disclosure.
Figure 11B:
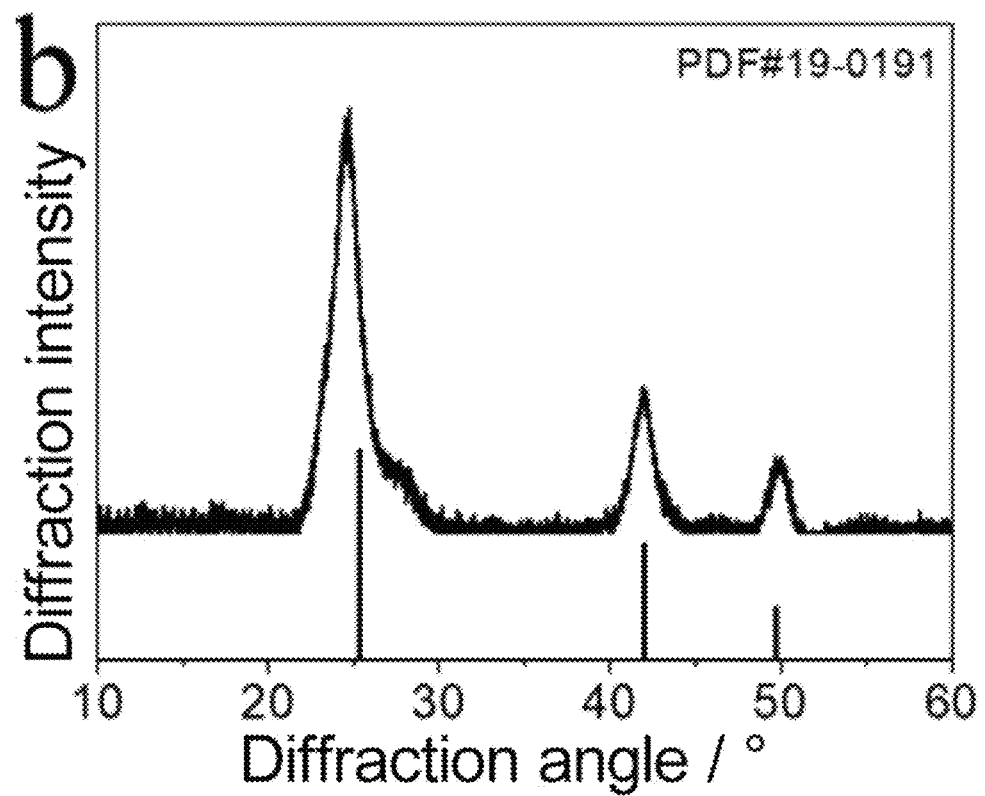
FIG. 11b is a XRD pattern of the CdSe/mesoporous molecular sieve nanocrystal fluorescent powder according to Example 12 of the disclosure.

As shown in the optical photograph of the CdSe/mesoporous molecular sieve perovskite semiconductor nanocrystal fluorescent powder in FIG. 11a, the CdSe/mesoporous molecular sieve perovskite semiconductor nanocrystal fluorescent powder was in a form of orange yellow powder (the orange yellow is not visible in FIG. 11a due to the grayscale photo). FIG. 11b showed the XRD pattern of the CdSe/mesoporous molecular sieve perovskite semiconductor nanocrystal fluorescent powder, the semiconductor nanocrystals exhibited cubic CdSe structure (corresponding PDF card was #19-0191), which fully proved that CdSe semiconductor nanocrystals were formed after high temperature calcination.

Example 13 Preparation of Mesoporous Molecular Sieve-Encapsulated ZnS (Binary Structure) Nanocrystal Fluorescent Powder (1) 0.6 mmol of a precursor $Zn(NO_3)_2 \cdot 6H_2O$ (178.5 mg) and 0.6 mmol of a precursor $Na_2S$ (46.8 mg) were dissolved in 50 mL of ultrapure water and stirred constantly to form a clear solution.
(2) 675.9 mg (i.e., a weight ratio of the mesoporous molecular sieve to the sum of the $Zn(NO_3)_2 \cdot 6H_2O$ and $Na_2S$ was 3:1) of a mesoporous molecular sieve with a pore size of 3.6 nm was added into the above clear solution followed by stirring at 60° C. for 30 min to form a mixed solution.
(3) The mixed solution was dried in a constant temperature drying oven at 100° C. for 12 h to obtain a solid powder.
(4) The solid powder was spread evenly into a corundum crucible, and then the corundum crucible was transferred to a high-temperature furnace.
(5) The corundum crucible was heated to 700° C. at a heating rate of 5° C./min and maintained for 30 min. The corundum crucible was taken out after naturally cooling to room temperature.
(6) The obtained product was ground fully and then dispersed in 50 mL of water to wash away the unstable ZnS semiconductor nanocrystals on the surface of the molecular sieve. The dispersion was centrifuged at 10,000 rpm three times each for 1 min, and the obtained precipitate was dried in the constant temperature drying oven at 60° C. for 6 h to obtain ZnS/mesoporous molecular sieve semiconductor nanocrystal fluorescent powder.

Example 14 Preparation of Mesoporous Molecular Sieve-Encapsulated CdTe (Binary Structure) Nanocrystal Fluorescent Powder (1) 0.6 mmol of a precursor $Cd(NO_3)_2$ (141.6 mg) and 0.6 mmol of a precursor Te powder (75.6 mg) were dissolved in 50 mL of ultrapure water and stirred constantly to form a clear solution.
(2) 645.5 mg (i.e., a weight ratio of the mesoporous molecular sieve to the sum of the $Cd(NO_3)_2$ and Te was 3:1) of mesoporous molecular sieves with a pore size of 3.6 nm was added into the above clear solution followed by stirring at 60° C. for 30 min to form a mixed solution.
(3) The mixed solution was dried in a constant temperature drying oven at 100° C. for 12 h to obtain a solid powder.
(4) The solid powder was spread evenly into a corundum crucible, and then the corundum crucible was transferred to a high-temperature furnace.
(5) The corundum crucible furnace was heated to 700° C. at a heating rate of 5° C./min, maintained at 700° C. for 30 min and taken out after naturally cooling to room temperature.
(6) The obtained product was ground fully and then dispersed in 50 mL of water to wash away the unstable CdTe semiconductor nanocrystals on the surface of the molecular sieve. The dispersion was centrifuged at 10,000 rpm three times each for 1 min, and the obtained precipitate was dried in the constant temperature drying oven at 60° C. for 6 h to obtain CdTe/mesoporous molecular sieve semiconductor nanocrystal fluorescent powder.

Example 15 Preparation of Mesoporous Molecular Sieve-Encapsulated $CuInS_2$ (IB-IIIA-VIA Ternary Type) Nanocrystal Fluorescent Powder (1) 1.2 mmol of a precursor $Na_2S$ (93.6 mg), 0.6 mmol of a precursor $In(C_2H_3O_2)_3$ (175.2 mg) and 0.6 mmol of a precursor CuI (114.3 mg) were dissolved in 50 mL of ultrapure water and stirred constantly to form a clear solution.
(2) 1149.3 mg (i.e., a weight ratio of the mesoporous molecular sieve to the sum of the $Na_2S$, $In(C_2H_3O_2)_3$ and CuI was 3:1) of mesoporous molecular sieve with a pore size of 3.6 nm was added into the above clear solution and stirred at 60° C. for 30 min to form a mixed solution.
(3) The mixed solution was dried in a constant temperature drying oven at 100° C. for 12 h to obtain a solid powder.
(4) The solid powder was spread evenly into a corundum crucible, and then the corundum crucible was transferred to a high-temperature furnace.
(5) The corundum crucible was heated to 700° C. at a heating rate of 5° C./min, maintained at 700° C. for 30 min. The corundum crucible was taken out after naturally cooling to room temperature.
(6) The obtained product was ground fully and then dispersed in 50 mL of water to wash away the unstable nanocrystals on the surface of the molecular sieve. The dispersion was centrifuged at 10,000 rpm three times each for 1 min, and the obtained precipitate was dried in the constant temperature drying oven at 60° C. for 6 h to obtain $CuInS_2$/mesoporous molecular sieve semiconductor nanocrystal fluorescent powder.

Figure 12A:
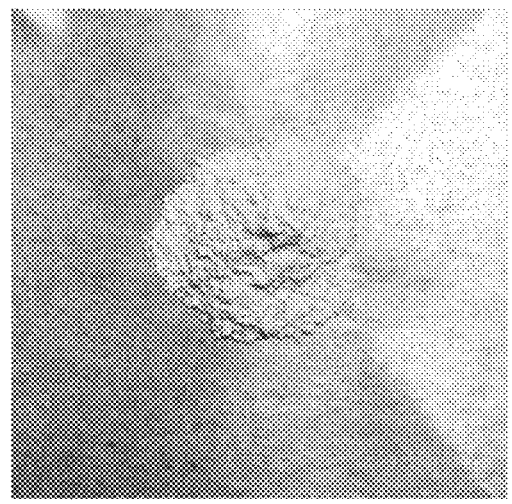
FIG. 12a is an optical photograph of a CuInS$_2$/mesoporous molecular sieve nanocrystal fluorescent powder according to Example 15 of the disclosure.
Figure 12B:
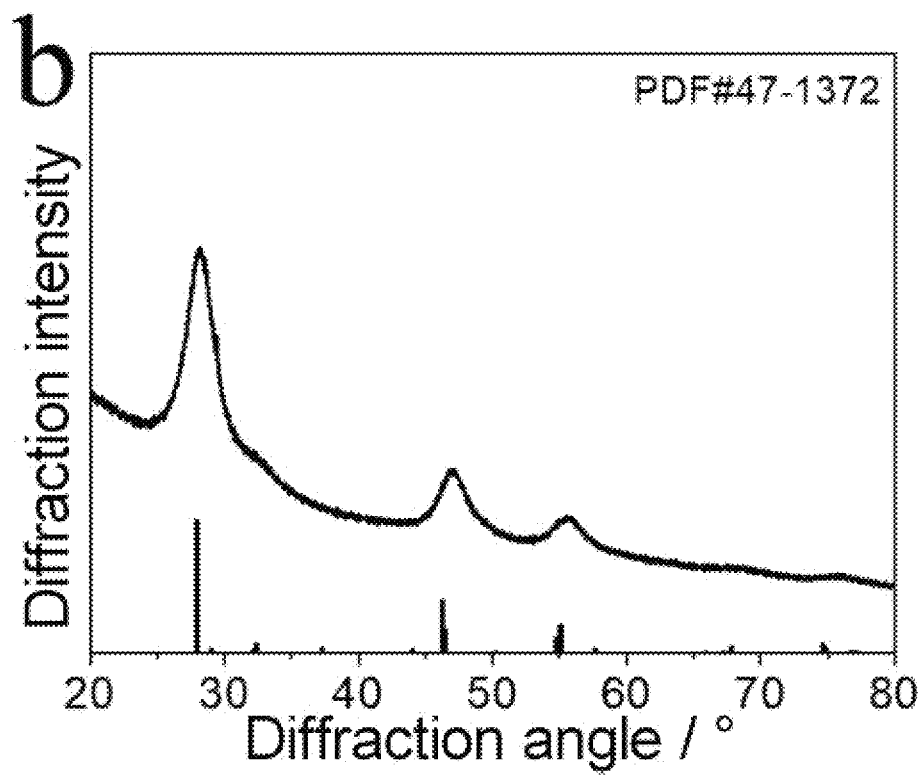
FIG. 12b is a XRD pattern of the CuInS$_2$/mesoporous molecular sieve nanocrystal fluorescent powder according to Example 15 of the disclosure.

As shown in the optical photograph of the $CuInS_2$/mesoporous molecular sieve perovskite semiconductor nanocrystal fluorescent powder in FIG. 12a, the $CuInS_2$/mesoporous molecular sieve perovskite semiconductor nanocrystal fluorescent powder was in a form of pink powder (the pink is not visible in FIG. 12a due to the grayscale photo). FIG. 12b showed the XRD pattern of the $CuInS_2$/mesoporous molecular sieve perovskite semiconductor nanocrystal fluorescent powder, it can be seen that the $CuInS_2$ semiconductor nanocrystals were formed after high temperature calcination, and the corresponding PDF card was #47-1372.

Comparative Example 1 Liquid phase synthesis of $CsPbBr_3$ 10 mmol of $Cs_2CO_3$ was added into a 100 mL three-necked flask, to which 20 mL of oleic acid and 20 mL of oleylamine were added in sequence. The system was vacuumed at 120° C. for 30 min, during which the nitrogen replacement was performed several times. Then the mixture was heated to 150° C. under the protection of nitrogen to form a transparent solution, kept at 150° C. for 1 h, and then cooled to obtain the precursor cesium oleate. 2 mmol of $PbBr_2$, 20 mL of octadecene, 5 mL of oleic acid and 5 mL of oleylamine were added into a 100 mL three-necked flask, and the system was vacuumed at 120° C. for 30 min, during which the nitrogen replacement was performed several times. Then the mixture was raised to 180° C. under the protection of nitrogen, immediately added with 1 mL of the cesium oleate precursor solution and reacted for 10 s. Then the flask was cooled in an ice water bath, and the semiconductor nanocrystals were subjected to extraction and washing with toluene and methyl acetate. Subsequently, the $CsPbBr_3$ nanocrystal solution was dissolved in 20 mL of toluene for later use.

It has also been found that in the preparation of the fluorescent semiconductor nanocrystal materials, regardless of normal pressure (0.1 MPa) or high pressure (greater than 0.1 MPa, less than 20 MPa), the prepared semiconductor nanocrystal fluorescent materials all had a highly-stable structure.

Examples 16-20 were some specific examples for the high-pressure preparation of semiconductor nanocrystal fluorescent powder.

Example 16 Preparation of Mesoporous Molecular Sieve-Encapsulated $CsPbBr_3$ (Perovskite Structure $ABX_3$) Semiconductor Nanocrystal Fluorescent Powder (1) 0.6 mmol of a precursor CsBr (127.7 mg) and 0.6 mmol of a precursor $PbBr_2$ (221.4 mg) were dissolved in 50 mL of ultrapure water and stirred constantly to form a clear solution.

(2) 1047.3 mg (i.e., a weight ratio of the mesoporous molecular sieve to the sum of the CsBr and $PbBr_2$ was 3:1) of a mesoporous molecular sieve with a pore size of 3.6 nm) was added into the above clear solution followed by stirring at 60° C. for 30 min to form a mixed solution.

(3) The mixed solution was dried in a constant temperature drying oven at 100° C. for 12 h to obtain a solid powder.

(4) The solid powder was spread evenly into a corundum crucible, and then the corundum crucible was transferred to a high-temperature furnace.

(5) The corundum crucible was heated to 700° C. at a heating rate of 5° C./min, maintained at 700° C. for 30 min under a pressure of 2.0 MPa and taken out after naturally cooling to room temperature.

(6) The obtained product was ground fully and then dispersed in 50 mL of water to wash away the unstable perovskite nanocrystals on the surface of the molecular sieve. The dispersion was centrifuged at 10,000 rpm three times each for 1 min, and the obtained precipitate was dried in the constant temperature drying oven at 60° C. for 6 h to obtain $CsPbBr_3$/mesoporous molecular sieve nanocrystal fluorescent powder.

Example 17 Preparation of Mesoporous Alumina Molecular Sieve-Encapsulated $CsPbBr_3$ (Perovskite $ABX_3$) Semiconductor Nanocrystal Fluorescent Powder (1) 0.6 mmol of a precursor CsBr (127.7 mg) and 0.6 mmol of a precursor $PbBr_2$ (221.4 mg) were dissolved in 50 mL of ultrapure water followed by stirring constantly to form a clear solution.

(2) 1047.3 mg (i.e., a weight ratio of the mesoporous alumina molecular sieve to the sum of the CsBr and $PbBr_2$ was 3:1) of mesoporous alumina molecular sieve with a pore size of 3.6 nm) was added into the above clear solution and stirred at 60° C. for 30 min to form a mixed solution.

(3) The mixed solution was dried in a constant temperature drying oven at 100° C. for 12 h to obtain a solid powder.

(4) The solid powder was spread evenly into a corundum crucible, and then the corundum crucible was transferred to a high-temperature furnace.

(5) The corundum crucible was heated to 1000° C. at a heating rate of 5° C./min, maintained at 1000° C. for 30 min under a pressure of 10.0 MPa and taken out after naturally cooling to room temperature.

(6) The obtained product was ground fully and then dispersed in 50 mL of water to wash away the unstable perovskite nanocrystals on the surface of the molecular sieve. The dispersion was centrifuged at 10,000 rpm three times each for 1 min, and the obtained precipitate was dried in the constant temperature drying oven at 60° C. for 6 h to obtain $CsPbBr_3$/mesoporous alumina molecular sieve nanocrystal fluorescent powder.

Example 18 Preparation of Mesoporous Silica-Encapsulated $CsPbBr_3$ (Perovskite $ABX_3$) Semiconductor Nanocrystal Fluorescent Powder (1) 0.6 mmol of a precursor CsBr (127.7 mg) and 0.6 mmol of a precursor $PbBr_2$ (221.4 mg) were dissolved in 50 mL of ultrapure water and stirred constantly to form a clear solution.

(2) 1047.3 mg (i.e., a weight ratio of the mesoporous silica to the sum of the CsBr and $PbBr_2$ was 3:1) of a mesoporous silica with a pore size of 3.6 nm was added into the above clear solution and stirred at 60° C. for 30 min to form a mixed solution.

(3) The mixed solution was dried in a constant temperature drying oven at 100° C. for 12 h to obtain a solid powder.

(4) The solid powder was spread evenly into a corundum crucible, and then the corundum crucible was transferred to a high-temperature furnace.

(5) The corundum crucible was heated to 700° C. at a heating rate of 5° C./min, maintained at 700° C. for 30 min under a pressure of 20.0 MPa and taken out after naturally cooling to room temperature.

(6) The obtained product was ground fully and then dispersed in 50 mL of water to wash away the unstable perovskite nanocrystals on the surface of the molecular sieve. The dispersion was centrifuged at 10,000 rpm three times each for 1 min, and the obtained precipitate was dried in the constant temperature drying oven at 60° C. for 6 h to obtain $CsPbBr_3$/mesoporous silica nanocrystal fluorescent powder.

Example 19 Preparation of Mesoporous Molecular Sieve-Encapsulated $CsPbCl_3$ (Perovskite $ABX_3$) Semiconductor Nanocrystal Fluorescent Powder (1) 0.6 mmol of a precursor CsCl (101.0 mg) and 0.6 mmol of a precursor $PbCl_2$ (169.9 mg) were dissolved in 50 mL of ultrapure water followed by stirring constantly to form a clear solution.

(2) 803.7 mg (i.e., a weight ratio of the mesoporous molecular sieve to the sum of the CsCl and $PbCl_2$ was 3:1) of a mesoporous molecular sieve with a pore size of 3.6 nm was added into the above clear solution and stirred at 60° C. for 30 min to form a mixed solution.

(3) The mixed solution was dried in a constant temperature drying oven at 100° C. for 12 h to obtain a solid powder.

(4) The solid powder was spread evenly into a corundum crucible, and then the corundum crucible was transferred to a high-temperature furnace.
(5) The corundum crucible was heated to 700° C. at a heating rate of 5° C./min, maintained at 700° C. for 30 min under a pressure of 2.0 MPa and taken out after naturally cooling to room temperature.
(6) The obtained product was ground fully and then dispersed in 50 mL of water to wash away the unstable perovskite nanocrystals on the surface of the molecular sieve. The dispersion was centrifuged at 10,000 rpm three times each for 1 min, and the obtained precipitate was dried in the constant temperature drying oven at 60° C. for 6 h to obtain $CsPbCl_3$/mesoporous molecular sieve nanocrystal fluorescent powder.

Figure 13:
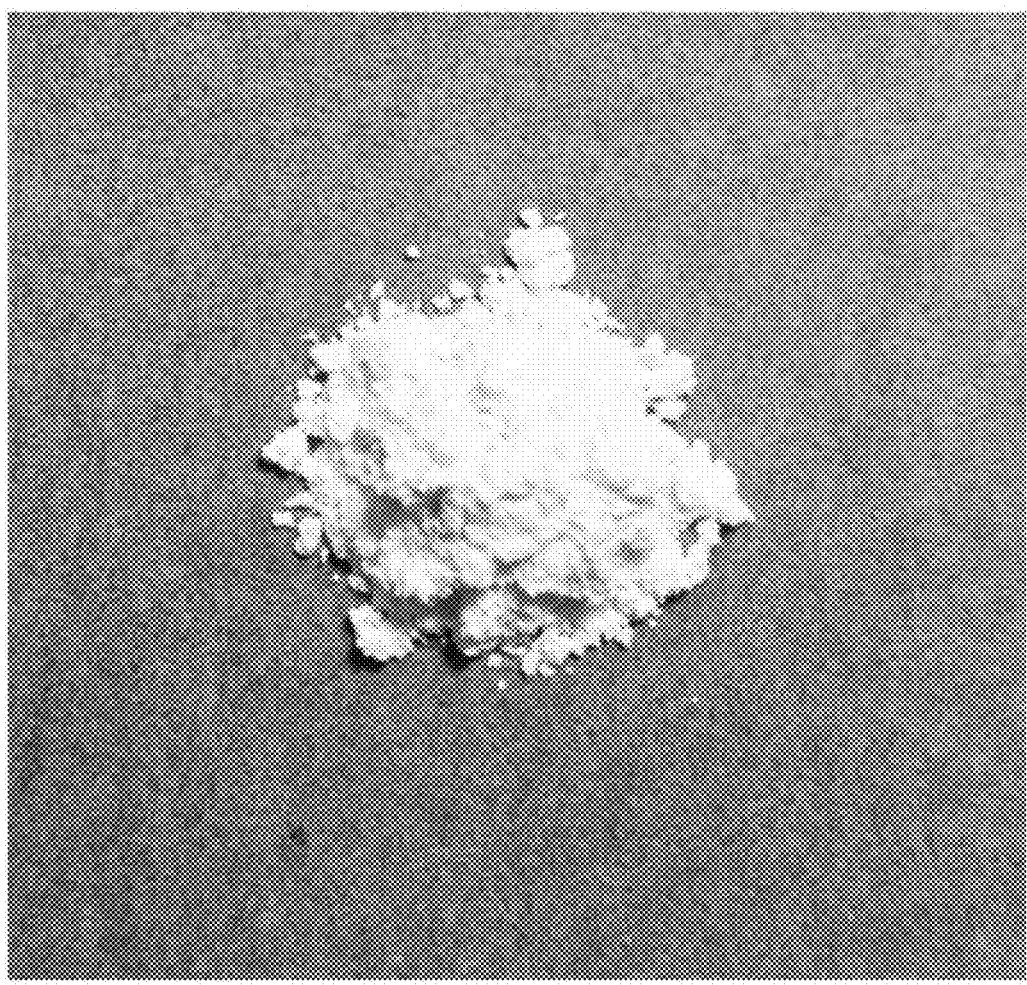
FIG. 13 is an optical photograph of a CsPbCl$_3$/mesoporous molecular sieve perovskite semiconductor nanocrystal fluorescent powder according to Example 19 of the disclosure.

As shown in the optical photograph of the $CsPbCl_3$/mesoporous molecular sieve perovskite semiconductor nanocrystal fluorescent powder in FIG. 13, the $CsPbCl_3$/mesoporous molecular sieve perovskite semiconductor nanocrystal fluorescent powder was in a form of white powder.

Example 20 Preparation of Mesoporous Molecular Sieve-Encapsulated $CsPbI_3$ (Perovskite $ABX_3$) Semiconductor Nanocrystal Fluorescent Powder (1) 0.6 mmol of a precursor CsI (155.9 mg) and 0.6 mmol of a precursor $PbI_2$ (276.6 mg) were dissolved in 50 mL of ultrapure water and stirred constantly to form a clear solution.
(2) 1297.5 mg (i.e., a weight ratio of the mesoporous molecular sieve to the sum of the CsI and $PbI_2$ was 3:1) of a mesoporous molecular sieve with a pore size of 3.6 nm was added into the above clear solution and stirred at 60° C. for 30 min to form a mixed solution.
(3) The mixed solution was dried in a constant temperature drying oven at 100° C. for 12 h to obtain a solid powder.
(4) The solid powder was spread evenly into a corundum crucible, and then the corundum crucible was transferred to a high-temperature furnace.
(5) The corundum crucible was heated to 700° C. at a heating rate of 5° C./min, maintained at 700° C. for 30 min under a pressure of 2.0 MPa and taken out after naturally cooling to room temperature.
(6) The obtained product was ground fully and then dispersed in 50 mL of water to wash away the unstable perovskite nanocrystals on the surface of the molecular sieve. The dispersion was centrifuged at 10,000 rpm three times each for 1 min, and the obtained precipitate was dried in the constant temperature drying oven at 60° C. for 6 h to obtain $CsPbI_3$/mesoporous molecular sieve nanocrystal fluorescent powder.

Figure 14:
FIG. 14 is an optical photograph of a CsPbI$_3$/mesoporous molecular sieve perovskite semiconductor nanocrystal fluorescent powder according to Example 20 of the disclosure.

As shown in the optical photograph of the $CsPbI_3$/mesoporous molecular sieve perovskite semiconductor nanocrystal fluorescent powder in FIG. 14, the $CsPbI_3$/mesoporous molecular sieve perovskite semiconductor nanocrystal fluorescent powder was in a form of gray powder.

In addition to the above practice of preparing semiconductor nanocrystal fluorescent powder, the semiconductor nanocrystal fluorescent films were needed in some application fields. Example 21 was given as an example of preparing semiconductor nanocrystal fluorescent film.

Example 21 Preparation of Mesoporous Molecular Sieve-Encapsulated $CsPbBr_3$ (Perovskite $ABX_3$) Semiconductor Nanocrystal Fluorescent Film (1) 0.6 mmol of a precursor CsBr (127.7 mg) and 0.6 mmol of a precursor $PbBr_2$ (221.4 mg) were dissolved in 50 mL of ultrapure water and stirred constantly to form a clear solution.
(2) 1047.3 mg (i.e., a weight ratio of the mesoporous molecular sieve to the sum of the CsBr and $PbBr_2$ was 3:1) of a mesoporous molecular sieve with a pore size of 3.6 nm was added into the above clear solution followed by stirring at 60° C. for 30 min to form a mixed solution.
(3) The mixed solution was coated on a glass sheet (15 mm×15 mm) and then dried in the constant temperature drying oven at 100° C. for 12 h to obtain a membrane precursor.
(4) The membrane precursor was transferred to a high-temperature furnace.
(5) The membrane precursor was heated to 700° C. at a heating rate of 5° C./min, maintained at 700° C. for 30 min. The semiconductor nanocrystal fluorescent film was obtained after naturally cooling to room temperature.

Figure 15:
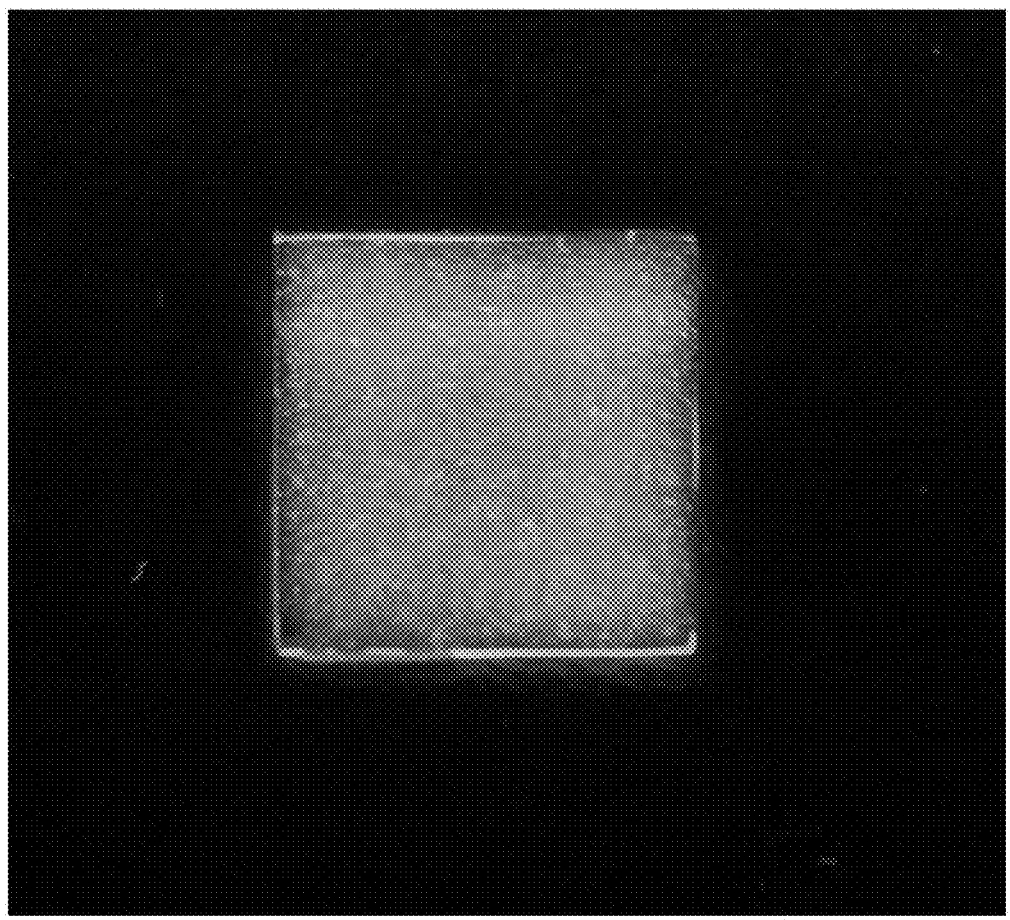
FIG. 15 is an image of a CsPbBr$_3$/mesoporous molecular sieve perovskite semiconductor nanocrystal fluorescent film according to Example 21 under ultraviolet light irradiation.

As shown in the image of the $CsPbI_3$/mesoporous molecular sieve perovskite semiconductor nanocrystal fluorescent film under ultraviolet light irradiation in FIG. 15, the $CsPbI_3$/mesoporous molecular sieve perovskite semiconductor nanocrystal fluorescent film exhibited uniform green fluorescence.

Example 22 described an application of the nanocrystal phosphor on the LED device.

Example 22 Fabrication of LED Device 5 mg of $CsPbBr_3$/mesoporous molecular sieve nanocrystal fluorescent powder prepared in Example 1 and 8 mg of $CsPbI_3$/mesoporous molecular sieve nanocrystal fluorescent powder prepared in Example 19 were mixed with 200 mg of ultraviolet curing glue and fully ground. Then the mixture was coated on a blue LED chip followed by curing for 30 s under an ultraviolet lamp to obtain a white LED device.

It was demonstrated by analysis that the fluorescent semiconductor nanocrystal powder prepared in the Examples 2-21 all exhibited narrow half-band width, excellent stability, strong moisture, temperature and corrosion resistance and slow or even no attenuation of fluorescence intensity over time, which were similar to those of the semiconductor nanocrystal fluorescent powder prepared in Example 1. This result indicated that the stability of the semiconductor nanocrystal fluorescent powder was greatly improved by coating with a micro/mesoporous material at high temperature.

Example 23 provided an application of the nanocrystal fluorescent powder in the field of color conversion panels.

Example 23

A color conversion panel was prepared according to a method commonly used in the art, which included a substrate, at least two sets of color filters, and two different color conversion layers on the two sets of color filters. The first color conversion layer included the $CsPbBr_3$ nanocrystal (green fluorescence) prepared in Example 21, and the second color conversion layer included the $CsPbI_3$ nanocrystal (red fluorescence) prepared in Example 20.

Example 24

The preparation process in this example was basically the same as that of Example 23, except that the color conversion panel further included a third color conversion layer, and the third color conversion layer included the $CsPbCl_3$ nanocrystal (blue fluorescence) prepared in Example 19.

The above are only preferred embodiments of the present disclosure, and are not intended to limit the scope of the present disclosure. Any changes, modifications and improvements made by those skilled in the art without departing from the spirit of the present disclosure shall fall within the scope of the present disclosure defined by the appended claims.

What is claimed is:

1. A method for preparing a fluorescent semiconductor nanocrystal material, comprising:
   (1) uniformly mixing at least one semiconductor nanocrystal precursor with a micro/mesoporous material to form a mixture; and
   (2) calcining the mixture under a temperature higher than or equal to a collapse temperature of the micro/mesoporous material to make pores of the micro/mesoporous material collapse, encapsulating the at least one semiconductor nanocrystal precursor in the pores of the micro/mesoporous material to produce the fluorescent semiconductor nanocrystal material;
   wherein the at least one fluorescent semiconductor nanocrystal material is in a form of powder.

2. The method of claim 1, wherein a ratio of a total weight of the at least one semiconductor nanocrystal precursor to a weight of the micro/mesoporous material is 1:(0.05-20); and the at least one semiconductor nanocrystal precursor and the micro/mesoporous material are mixed uniformly through liquid phase mixing or solid phase mixing.

3. The method of claim 1, wherein a pore size of the micro/mesoporous material is 0.5-50 nm.

4. The method of claim 1, wherein in step (2), the calcination of the mixture is performed at 300-2000° C. for 10-600 min.

5. The method of claim 1, wherein in step (2), the calcination of the mixture is performed at a pressure of 0.1-20 MPa.

6. The method of claim 1, wherein the at least one semiconductor nanocrystal precursor consists of an AX precursor and a $BX_2$ precursor; a molar ratio of the AX precursor to the $BX_2$ precursor is 1:1; wherein A is Cs, Rb or K; B is Pb, Sn, Ge, In, Ag, Bi, Sb, Zn, Ca or Ba; and X is Cl, Br or I.

7. The method of claim 1, wherein the at least one semiconductor nanocrystal precursor consists of an AX precursor, a $B'X_2$ precursor and a $BX_2$ precursor; a molar ratio of the AX precursor to the sum of the $B'X_2$ precursor and the $BX_2$ precursor is 1:1; wherein A is Cs, Rb or K; B' and B are different, and are each independently selected from the group consisting of Pb, Sn, Ge, In, Ag, Bi, Sb, Zn, Ca and Ba; and X is Cl, Br or I.

8. The method of claim 1, wherein the at least one semiconductor nanocrystal precursors consists of a cationic precursor and an anionic precursor; a molar ratio of the cationic precursor to the anionic precursor is 1:1; the cationic precursor is used to provide a cation $D^{n+}$, wherein n is an integer selected from 1-10; the cationic precursor is selected from the group consisting of hydrochlorides and nitrates of Zn, Cd and Hg, and hydrate thereof; the anionic precursor is used to provide an anion $Y^{n-}$, wherein n is an integer selected from 1-10; and the anionic precursor is selected from the group consisting of simple substances and inorganic salts of S, Se, Te.

9. The method of claim 1, wherein the at least one semiconductor nanocrystal precursor consists of a first precursor for providing a monovalent cation, a second precursor for providing a trivalent cation and a third precursor for providing a divalent anion;
   wherein the first precursor is a compound of a IB group metal, and is selected from the group consisting of CuCl, CuBr, CuI, AgCl, AgBr, AgI and a combination thereof;
   the second precursor is an organic acid salt of a IIIA group metal, and is selected from the group consisting of formate, acetate and propionate of In, Ga and Al;
   the third precursor is an inorganic salt consisting of a VIA group element and a metal element, wherein the VIA group element is S and Se; and
   a molar ratio of the first precursor to the second precursor to the third precursor is 0.5:0.5:1.

10. The method of claim 1, wherein the micro/mesoporous material is a microporous material, a mesoporous material or a combination thereof, the microporous material is selected from the group consisting of microporous molecular sieve, microporous silica, microporous titania, microporous alumina, microporous transition metal oxide, microporous sulfide, silicate, aluminate and transition metal nitride and a combination thereof; and the mesoporous material is selected from the group consisting of mesoporous molecular sieve, mesoporous silica, mesoporous titania, mesoporous alumina, mesoporous carbon, mesoporous transition metal oxide, mesoporous sulfide, silicate, aluminate and transition metal nitride and a combination thereof.

11. A fluorescent semiconductor nanocrystal material prepared by the method of claim 6, wherein the fluorescent semiconductor nanocrystal material has a nanocrystal structure of perovskite $ABX_3$; a molar ratio of A to B to X in $ABX_3$ is 1:1:3; A is Cs, Rb or K; B is Pb, Sn, Ge, In, Ag, Bi, Sb, Zn, Ca or Ba; and X is Cl, Br or I.

12. A fluorescent semiconductor nanocrystal material prepared by the method of claim 7, wherein the fluorescent semiconductor nanocrystal material has a nanocrystal structure of halide $B'X_2$-modified perovskite $ABX_3$, and a molar ratio of A to (B'+B) to X is 1:1:3; A is Cs, Rb or K; B' and B are different, and are independently selected from the group consisting of Pb, Sn, Ge, In, Ag, Bi, Sb, Zn, Ca and Ba; and X is Cl, Br or I.

13. A fluorescent semiconductor nanocrystal material prepared by the method of claim 8, wherein the fluorescent semiconductor nanocrystal material has a binary $D^{n+}Y^{n-}$ nanocrystal structure; n is an integer selected from 1-10; a molar ratio of D to Y in $D^{n+}Y^{n-}$ is 1:1; and D is Zn, Cd or Hg, and Y is S, Se or Te.

14. A fluorescent semiconductor nanocrystal material prepared by the method of claim 9, wherein the fluorescent semiconductor nanocrystal material has a ternary IB-IIIA-VIA nanocrystal structure with a general formula of $G^+M^{3+}(N^{2-})_2$, wherein $G^+$ is $Cu^+$ or $Ag^+$; $M^{3+}$ is $In^{3+}$, $Ga^{3+}$ or $Al^{3+}$; $N^{2-}$ is $S^{2-}$ or $Se^{2-}$; and a molar ratio of $G^+$ to $M^{3+}$ to $N^{2-}$ is 0.5:0.5:1.

15. A light-emitting diode (LED) device, wherein the LED device comprises the fluorescent semiconductor nanocrystal material of claim 11.

16. A color conversion display panel, wherein the color conversion display panel comprises the fluorescent semiconductor nanocrystal material of claim 11.

17. A fluorescent scintillator, wherein the fluorescent scintillator is made of the fluorescent semiconductor nanocrystal material of claim 11.

18. A biological detection device, wherein the biological detection device comprises the fluorescent semiconductor nanocrystal material of claim 11.

* * * * *